United States Patent
Aoki

(10) Patent No.: US 10,270,462 B2
(45) Date of Patent: Apr. 23, 2019

(54) DIGITAL ANALOG CONVERSION CIRCUIT, DATA DRIVER, DISPLAY DEVICE, ELECTRONIC APPARATUS AND DRIVING METHOD OF DIGITAL ANALOG CONVERSION CIRCUIT, DRIVING METHOD OF DATA DRIVER, AND DRIVING METHOD OF DISPLAY DEVICE

(71) Applicant: Sony Corporation, Tokyo (JP)

(72) Inventor: Takeshi Aoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/569,285

(22) PCT Filed: Mar. 22, 2016

(86) PCT No.: PCT/JP2016/058994
§ 371 (c)(1),
(2) Date: Oct. 25, 2017

(87) PCT Pub. No.: WO2016/199470
PCT Pub. Date: Dec. 15, 2016

(65) Prior Publication Data
US 2018/0131385 A1    May 10, 2018

(30) Foreign Application Priority Data
Jun. 8, 2015 (JP) .................. 2015-115528

(51) Int. Cl.
*H03M 1/68* (2006.01)
*G09G 3/20* (2006.01)
(Continued)

(52) U.S. Cl.
CPC ............... *H03M 1/68* (2013.01); *G09G 3/20* (2013.01); *G09G 3/30* (2013.01); *G09G 3/3275* (2013.01);
(Continued)

(58) Field of Classification Search
CPC .......... H03M 1/68; H03M 1/12; H03M 1/745; H03M 1/76
(Continued)

(56) References Cited

U.S. PATENT DOCUMENTS 6,246,351 B1 * 6/2001 Yilmaz ............... H03M 1/0682
341/136
6,369,743 B2 * 4/2002 Ono ....................... H03F 1/086
341/118
7,283,082 B1 * 10/2007 Kuyel ................... H03M 1/0682
341/145

FOREIGN PATENT DOCUMENTS

JP    2002-043944 A    2/2002
JP    2009-104056 A    5/2009

* cited by examiner

*Primary Examiner* — Peguy Jean Pierre
(74) *Attorney, Agent, or Firm* — Michael Best & Friedrich LLP

(57) ABSTRACT

A digital to analog conversion circuit is disclosed. In one example, the conversion circuit includes a selector unit and a differential amplifier. The selector unit includes a selector unit that selects nodes from a voltage dividing circuit based upon bit information of a higher order side of an input digital signal and outputs voltages of the selected nodes. The differential amplifier includes differential pairs to which the output voltages of the selector unit are input. When a voltage corresponding to the digital signal is output, after a correspondence relationship between the output voltages of the selector unit and the inputs of the respective differential pairs of the differential amplifier is allowed to have a short settling time, and is then controlled in accordance with the bit information of the lower order side of the input digital signal.

14 Claims, 12 Drawing Sheets

(51) Int. Cl.
 *G09G 3/30* (2006.01)
 *G09G 3/36* (2006.01)
 *H03M 1/76* (2006.01)
 *H03F 3/45* (2006.01)
 *G09G 3/3275* (2016.01)
 *H03M 1/74* (2006.01)

(52) U.S. Cl.
 CPC ............ *G09G 3/36* (2013.01); *H03F 3/45071* (2013.01); *H03M 1/76* (2013.01); *H03M 1/745* (2013.01); *H03M 1/765* (2013.01)

(58) Field of Classification Search
 USPC .................................. 341/155, 145, 144, 143
 See application file for complete search history.

FIG. 6A

| LOWER THREE BITS | | | PIN1(gm) | PIN2(gm) | PIN3(2gm) | PIN4(4gm) |
|---|---|---|---|---|---|---|
| 0 | 0 | 0 | DC1 | DC1 | DC1 | DC1 |
| 0 | 0 | 1 | ↓ | DC2 | ↓ | ↓ |
| 0 | 1 | 0 | ↓ | DC1 | DC2 | ↓ |
| 0 | 1 | 1 | ↓ | DC2 | ↓ | ↓ |
| 1 | 0 | 0 | ↓ | DC1 | DC1 | DC2 |
| 1 | 0 | 1 | ↓ | DC2 | ↓ | ↓ |
| 1 | 1 | 0 | ↓ | DC1 | DC2 | ↓ |
| 1 | 1 | 1 | ↓ | DC2 | ↓ | ↓ |

FIG. 6B

| LOWER THREE BITS | | | PIN1(gm) | PIN2(gm) | PIN3(2gm) | PIN4(4gm) |
|---|---|---|---|---|---|---|
| 0 | 0 | 0 | DC1 | DC1 | DC1 | DC1 |

FIG. 6C

| LOWER THREE BITS | | | PIN1(gm) | PIN2(gm) | PIN3(2gm) | PIN4(4gm) |
|---|---|---|---|---|---|---|
| 1 | 0 | 0 | DC1 | DC1 | DC1 | DC2 |

DIGITAL ANALOG CONVERSION CIRCUIT, DATA DRIVER, DISPLAY DEVICE, ELECTRONIC APPARATUS AND DRIVING METHOD OF DIGITAL ANALOG CONVERSION CIRCUIT, DRIVING METHOD OF DATA DRIVER, AND DRIVING METHOD OF DISPLAY DEVICE

TECHNICAL FIELD

The present disclosure relates to a digital analog conversion circuit, a data driver, a display device, an electronic apparatus, and a driving method of a digital analog conversion circuit, a driving method of a data driver, and a driving method of a display device

BACKGROUND ART

In display devices including a display panel such as an electroluminescence display panel or a liquid crystal display panel, a digital analog conversion circuit for generating a voltage corresponding to gradation of an image is used in order to display the image. For example, there is known a digital analog conversion circuit configured to appropriately select and output a voltage corresponding to a value of a gradation signal from among voltages divided by a voltage dividing circuit including a ladder resistor (gamma resistor) or the like.

However, in a digital analog conversion circuit having such a configuration, the scale of a voltage dividing circuit increases in accordance with the number of gradations, and the number of pieces of wiring pulling a voltage from the voltage dividing circuit also increases. Therefore, as the number of gradations increases, the circuit scale increases.

Therefore, as disclosed in, for example, U.S. Pat. No. 6,246,351 (Patent Document 1) and other documents, there is known a digital analog conversion circuit that outputs a voltage corresponding to a gradation value by selecting plurality of voltages from a voltage dividing circuit on the basis of bit information on the higher order side of a gradation value and driving a plurality of differential pairs forming a differential amplifier on the basis of the selected voltages and bit information on the lower order side of the gradation value.

CITATION LIST

Patent Document

Patent Document 1: U.S. Pat. No. 6,246,351

SUMMARY OF THE INVENTION

Problems to be Solved by the Invention

In a circuit configured to drive a plurality of differential pairs on the basis of a plurality of voltages selected on the basis of bit information on the higher order side of a gradation value and bit information on the lower order side of the gradation value, on the basis of the bit information on the lower order side of the gradation value, correspondence relationship of voltages to be input to the respective differential pairs is changed. For this reason, settling time is affected by the correspondence relationship between differential pairs and input voltages, and as a result, settling time varies. Therefore, using such a conversion circuit for driving a display device, it is conceivable that an image of the display device is affected by the variation of settling time.

Accordingly, an object of the present disclosure is to provide a digital analog conversion circuit, a data driver using the digital analog conversion circuit, a display device including the data driver, an electronic apparatus including the display device, a driving method of a digital analog conversion circuit, a driving method of a data driver, and a driving method of a display device which can reduce variations in settling time due to the correspondence relationship between differential pairs and voltages.

Solutions to Problems

A digital analog conversion circuit according to a first aspect of the present disclosure for achieving the above object includes:

a selector unit which selects a plurality of nodes from a voltage dividing circuit in accordance with bit information of a higher order side of an input digital signal and outputs voltages of the selected nodes; and a differential amplifier including a plurality of differential pairs to which the output voltages of the selector unit are input, a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier, and in which, when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

A data driver according to a first aspect of the present disclosure for achieving the above object is a data driver used for driving a display panel, the data driver including:

a selector unit which selects a plurality of nodes from a voltage dividing circuit in accordance with bit information of a higher order side of an input digital signal and outputs voltages of the selected nodes; and a differential amplifier including a plurality of differential pairs to which the output voltages of the selector unit are input, in which a correspondence relationship between the output voltages of the selector unit and inputs of the respective differential pairs of the differential amplifier is controlled in accordance with bit information of a lower order side of the input digital signal, whereby a voltage corresponding to the digital signal is output from the differential amplifier, and when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

A display device according to a first aspect of the present disclosure for achieving the above object includes:
a display panel; and
a data driver used for driving the display panel,
in which the data driver includes:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier is controlled in accordance with bit information of a lower order side of the input digital signal, whereby a voltage corresponding to the digital signal is output from the differential amplifier, and
when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

An electronic apparatus according to a first aspect of the present disclosure for achieving the above object is an electronic apparatus including a display device, in which the display device includes:
a display panel; and
a data driver used for driving the display panel,
the data driver includes:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier is controlled in accordance with bit information of a lower order side of the input digital signal, whereby a voltage corresponding to the digital signal is output from the differential amplifier, and
when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

A driving method of a digital analog conversion circuit according to a first aspect of the present disclosure for achieving the above object, the digital analog conversion circuit including:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier,
in which the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

A driving method of a data driver according to a first aspect of the present disclosure for achieving the above object is a driving method of a data driver for a display panel, the data driver including:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier,
in which, when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

A driving method of a display device according to a first aspect of the present disclosure for achieving the above object is a driving method of a display device, the display device including:
a display panel; and
a data driver used for driving the display panel,
the data driver including:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier, in which when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

Effects of the Invention

According to the digital analog conversion circuit, the data driver, the display device, and the electronic apparatus according to the first aspect of the present disclosure, when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal. As a result, variations in settling time are reduced. Note that effects described in the present disclosure are merely examples and thus are not limiting. Additional effects may also be further included.

BRIEF DESCRIPTION OF DRAWINGS

FIG. 6A is a table for explaining the relationship between lower three bits of an input signal and voltages input to respective differential pairs in the digital analog conversion circuit of the reference example. FIG. 6B is a table illustrating the relationship in which settling time is the longest in the relationship illustrated in FIG. 6A. FIG. 6C is a table illustrating the relationship in which settling time is the shortest in the relationship illustrated in FIG. 6A.

FIG. 10A is a front view thereof, and FIG. 10B is a rear view thereof.

MODE FOR CARRYING OUT THE INVENTION

Figure 1:
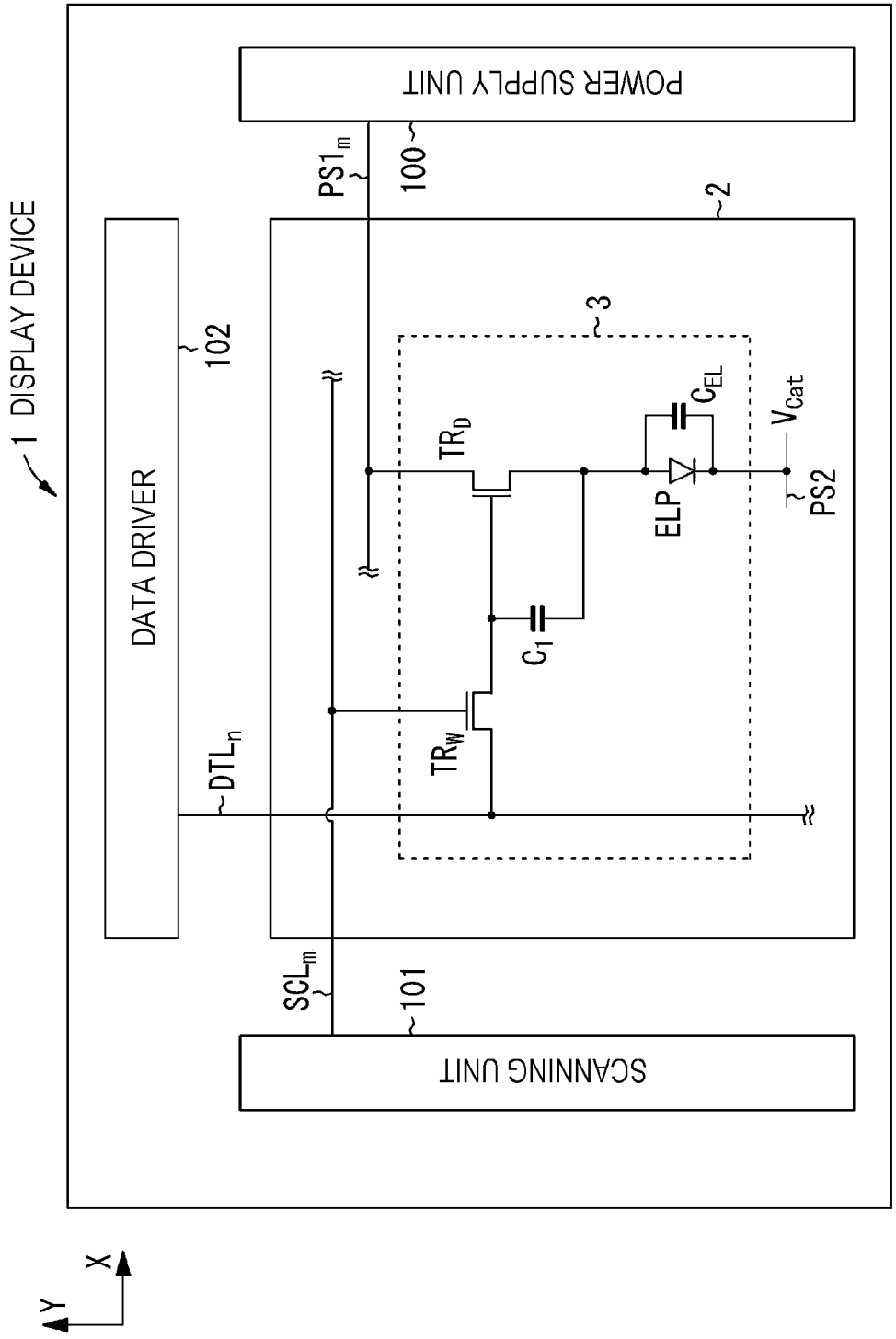
FIG. 1 is a conceptual diagram of a display device according to a first embodiment.

Hereinafter, the present disclosure will be described on the basis of embodiments with reference to the drawings. The present disclosure is not limited to the embodiments, and various numerical values and materials in the embodiments are examples. In the following description, the same symbols will be used for the same elements or elements having the same function, and redundant descriptions will be omitted. Note that explanation will be given in the order below.

1. General descriptions on a digital analog conversion circuit, a data driver, a display device, an electronic apparatus, and a driving method of a digital analog conversion circuit, a driving method of a data driver, and a driving method of a display device according to the present disclosure 2. First Embodiment 3. Description on electronic apparatus and others

[General descriptions on a digital analog conversion circuit, a data driver, a display device, an electronic apparatus, and a driving method of a digital analog conversion circuit, a driving method of a data driver, and a driving method of a display device according to the present disclosure]

In a digital analog conversion circuit, a data driver, a display device, and an electronic apparatus according to a first aspect of the present disclosure, a plurality of differential pairs of a differential amplifier may have a configuration including a differential pair having the same mutual conductance characteristics, or may have a configuration including a differential pair weighted on mutual conductance characteristics. This similarly applies to a plurality of differential pairs of a differential amplifier used in a driving method of a digital analog conversion circuit, a driving method of a data driver, and a driving method of a display device according to the first aspect of the present disclosure.

In this case, the differential amplifier may include a first differential pair, a second differential pair, a third differential pair, and a fourth differential pair ratios of weighting on a mutual conductance characteristic of which are 1:1:2:4, and in the correspondence relationship having short settling time between the output voltages of the selector unit and the inputs of the respective differential pairs of the differential amplifier, a voltage of one of two nodes selected by the selector unit may be input to the fourth differential pair, and a voltage of the other one may be input to the first differential pair, the second differential pair, and the third differential pair.

In the digital analog conversion circuit according to the first aspect of the present disclosure including the various preferred configurations described above, a period, in which the correspondence relationship between the output voltages of the selector unit and the inputs of the respective differential pairs of the differential amplifier is allowed to have a short settling time, may be set to a predetermined length. Moreover, a length of a period, in which the correspondence relationship between the output voltages of the selector unit and the inputs of the respective differential pairs of the differential amplifier is allowed to have a short settling time, may be controlled in accordance with the bit information of the lower order side of the input digital signal. Similarly, in the driving method of the digital analog conversion circuit according to the first aspect of the present disclosure, a period, in which the correspondence relationship between the output voltages of the selector unit and the inputs of the respective differential pairs of the differential amplifier is allowed to have a short settling time, may be set to a predetermined length. Moreover, a length of a period, in which the correspondence relationship between the output voltages of the selector unit and the inputs of the respective differential pairs of the differential amplifier is allowed to have a short settling time, may be controlled in accordance with the bit information of the lower order side of the input digital signal.

In the driving method of the data driver according to the first aspect of the present disclosure, a period, in which the correspondence relationship between the output voltages of the selector unit and the inputs of the respective differential pairs of the differential amplifier is allowed to have a short settling time, may be set to have a certain ratio to a scanning period in the display panel. Moreover, a ratio, to a scanning period in the display panel, of a length of a period, in which the correspondence relationship between the output voltages of the selector unit and the inputs of the respective differential pairs of the differential amplifier is allowed to have a short settling time, may be controlled in accordance with the bit information of the lower order side of the input digital signal. This similarly applies to the driving method of the display device according to the first aspect of the present disclosure.

Whether the correspondence relationship between the output voltages of the selector unit and the inputs of the respective differential pairs of the differential amplifier is allowed to have a short settling time is basically determined by whether a load of driving the respective differential pairs is relatively small. Therefore, the determination is basically made on the basis of a circuit configuration of the differential amplifier. It is only required that validity be confirmed as appropriate by an evaluation using an actual machine or the like.

Hereinafter, the digital analog conversion circuit, the data driver, the display device, and the electronic apparatus according to the first aspect of the present disclosure as well as the driving method of the digital analog conversion circuit, the driving method of the data driver, and the driving method of the display device according to the first aspect may be simply referred to as the present disclosure in some cases.

The digital analog conversion circuit and the data driver may be integrally configured in which respective components are integrated, or may be configured as separate bodies as appropriate. These can be configured using well-known circuit elements. For example, the voltage dividing circuit can be configured using a resistor or other components, and the selector unit can be configured by a logic circuit or other components. This similarly applies to a distribution unit illustrated in FIG. 1 to be described later. Furthermore, an operation amplifier circuit can be configured using a transistor, an operational amplifier, or other components. Note that the scanning unit and the power supply unit illustrated in FIG. 1 and the input signal processing unit and the lower gradation control unit illustrated in FIG. 4 can also be configured using well-known circuit elements.

A well-known display panel such as a liquid crystal display panel or an electroluminescence display panel can be exemplified as a display panel used in the display device of the present disclosure. A configuration of the display panel is not particularly limited as long as there is no problem in the operation as a display device.

The display panel may have a so-called monochrome display configuration or a color display configuration. In the case of a color display configuration, one pixel can include a plurality of subpixels, more specifically, one pixel can include three subpixels of a red light emitting subpixel, a green light emitting subpixel, and a blue light emitting subpixel. Furthermore, one pixel can include a set obtained by further adding one or more types of subpixels to these three kinds of subpixels (for example, a set added with a subpixel emitting white light for luminance improvement, a set added with a subpixel emitting a complementary color for enlargement of a color reproduction range, a set added with a subpixel emitting yellow for enlargement of a color reproduction range, or a set added with subpixels emitting yellow and cyan for enlargement of a color reproduction range).

As values of a pixel of the display panel, some resolutions for image display such as (3840, 2160) and (7680, 4320) can be exemplified in addition to U-XGA (1600, 1200), HD-TV (1920, 1080), and Q-XGA (2048, 1536); however, resolution is not limited thereto.

Various conditions herein are satisfied not only in a case where the conditions mathematically strictly hold but also in a case where they substantially hold. Various variations due to designing or manufacturing are allowed.

In a timing chart used in the following description, the length (time length) of a horizontal axis representing each period is merely schematic and does not represent the ratio of a time length of each period. This similarly applies to the vertical axis. The shape of a waveform in a timing chart is also schematic.

[First Embodiment]

A first embodiment relates to the digital analog conversion circuit, the data driver, the display device, the driving method of the digital analog conversion circuit, the driving method of the data driver, and the driving method of the display device according to the first aspect of the present disclosure.

FIG. 1 is a conceptual diagram of a display device according to the first embodiment. A display device 1 includes: a display panel 2 in which display elements 3 including a current-driven light emitting unit and a driving circuit for driving the light emitting unit are arranged in a two-dimensional matrix shape while connected to a scan line SCL extending in a row direction (X direction in FIG. 1) and a data line DTL extending in a column direction (Y direction in FIG. 1); and a data driver 102 for applying a voltage to the data line DTL. A scanning signal is supplied to the scan line SCL from the scanning unit 101. The light emitting unit forming the display element 3 includes, for example, an organic electroluminescence light emitting unit. Note that, for the convenience of illustration, FIG. 1 illustrates a connection relation of one display element 3, more specifically, for an (n, m)th display element 3 with will be described later. This similarly applies to FIG. 2 to be described later.

The display panel 2 further includes a feeder line PS1 connected to display elements 3 arranged in the row direction and a common feeder line PS2 commonly connected to all the display elements 3. A predetermined drive voltage is supplied from the power supply unit 100 to the feeder line PS1. A common voltage (e.g. ground potential) is supplied to the common feeder line PS2.

Although not illustrated in FIG. 1, an area (display area) in which the display panel 2 displays an image is formed by the display elements 3 arranged in a two-dimensional matrix shape of N display elements in the row direction and M display elements in the column direction, which totals N×M display elements 3. The number of rows of the display element 3 in the display area is M, and the number of the display elements 3 forming each of the rows is N.

Moreover, each of the number of the scan lines SCL and the number of the feeder lines PS1 is M. A display element 3 in the m-th row (where m=1, 2, . . . , M) is connected to the m-th scan line $SCL_m$ and the m-th feeder line $PS1_m$ and forms one display element row. Note that, in FIG. 1, only the feeder line $PS1_m$ is illustrated.

In addition, the number of data lines DTL is N. A display element 3 in the n-th column (where n=1, 2, . . . , N) is connected to the n-th data line $DTL_n$. Note that, in FIG. 1, only the data line $DTL_n$ is illustrated.

The display device 1 is, for example, a monochrome display device in which one display element 3 forms one pixel. By a scanning signal from the scanning unit 101, the display device 1 is line-sequentially scanned row by row. The display element 3 positioned in the m-th row and the n-th column is hereinafter referred to as the (n, m)th display element 3 or the (n, m)th pixel.

In the display device 1, display elements 3 each of which forms each of N pixels arranged in the m-th row are simultaneously driven. In other words, in the N display elements 3 arranged along the row direction, the timing of a light emission/no light emission is controlled by each row to which the display elements belong. In a case where a display frame rate of the display device 1 is expressed as FR (times/sec), a scanning period per row (so-called horizontal scanning period) when the display device 1 is line-sequentially scanned row by row is obtained as less than (1/FR)×(1/M) seconds.

To the data driver 102 of the display device 1, a digital signal $D_{sig}$ representing gradation corresponding to an image to be displayed is input from an apparatus (not illustrated), for example. Out of the input digital signal $D_{sig}$, a digital signal corresponding to the (n, m)th display element 3 may be represented as $D_{sig\,(n,\,m)}$.

For convenience of explanation, it is assumed that the number of gradation bits of the digital signal $D_{sig(n,\,m)}$ is twelve. A gradation value may be any value of 0 to 4095 depending on the brightness of an image to be displayed. Here, it is assumed that the luminance of the image to be displayed increases as the gradation value increases. Note that the number of gradation bits described above is merely an example. The number of gradation bits may be eight bits, 16 bits, 24 bits, or others.

The display element 3 includes at least a current driving type light emitting unit ELP, a write transistor $TR_W$, a driving transistor $TR_D$, and a capacitor $C_1$ and emits light when a current flows in the light emitting unit ELP via source/drain regions of the driving transistor $TR_D$. These transistors may be formed of, for example, a semiconductor thin film formed on a substrate such as glass, or may be provided on a silicon semiconductor substrate. Each of the transistors is formed by an n-channel type field effect transistor.

The capacitor $C_1$ is used to hold a voltage of a gate electrode (so-called gate-source voltage) with respect to a source region of the driving transistor $TR_D$. In a light emitting state of the display element 3, one of the source/drain regions (the one connected to the feeder line PS1 in FIG. 1) of the driving transistor $TR_D$ serves as a drain region and the other one of the source/drain regions (one end of the light emitting unit ELP, specifically, the one connected to an anode electrode) serves as a source region. One of the electrodes and the other one of the electrodes forming the capacitor $C_1$ are connected to the other one of the source/drain regions of the driving transistor $TR_D$ and the gate electrode, respectively.

The write transistor $TR_W$ has a gate electrode connected to the scan line SCL, one of the source/drain regions connected to the data line DTL, and the other one of the source/drain regions connected to the gate electrode of the driving transistor $TR_D$.

The gate electrode of the driving transistor $TR_D$ is connected to the other one of the source/drain regions of the write transistor $TR_W$ and the other one of the electrodes of the capacitor $C_1$, and the other one of the source/drain regions of the driving transistor $TR_D$ is connected to one of the electrodes of the capacitor $C_1$ and the anode electrode of the light emitting unit ELP.

The other end (specifically, cathode electrode) of the light emitting unit ELP is connected to the common feeder line PS2. A predetermined cathode voltage $V_{Cat}$ is supplied to the common feeder line PS2. Note that the capacitance of the light emitting unit ELP is denoted by a symbol $C_{EL}$.

When the write transistor $TR_W$ is rendered conductive by a scanning signal from the scanning unit 101 while a voltage corresponding to the luminance of an image to be displayed is supplied from the data driver 102 to the data line DTL, a voltage corresponding to the luminance of the image to be displayed is written in the capacitor $C_1$. After the write transistor $TR_W$ is rendered nonconductive, a current flows through the driving transistor $TR_D$ in accordance with the voltage held in the capacitor $C_1$, and the light emitting unit ELP emits light.

The display element forming the display device is not limited to the configuration illustrated in FIG. 1. An example having a display element of another configuration will be described.

Figure 2:
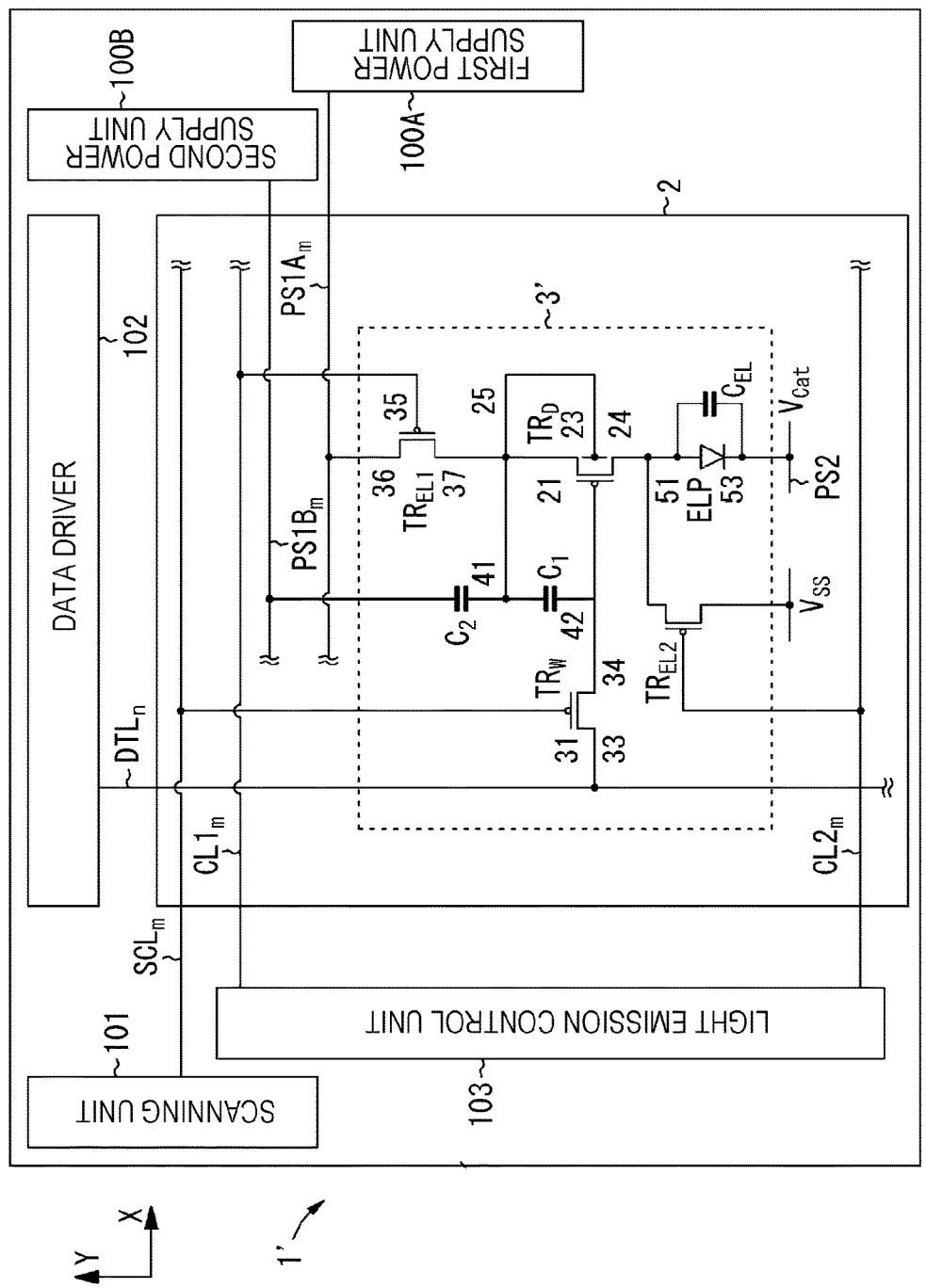
FIG. 2 is a conceptual diagram of a display device including a display element having a configuration different from that of the display element illustrated in FIG. 1.
Figure 3:
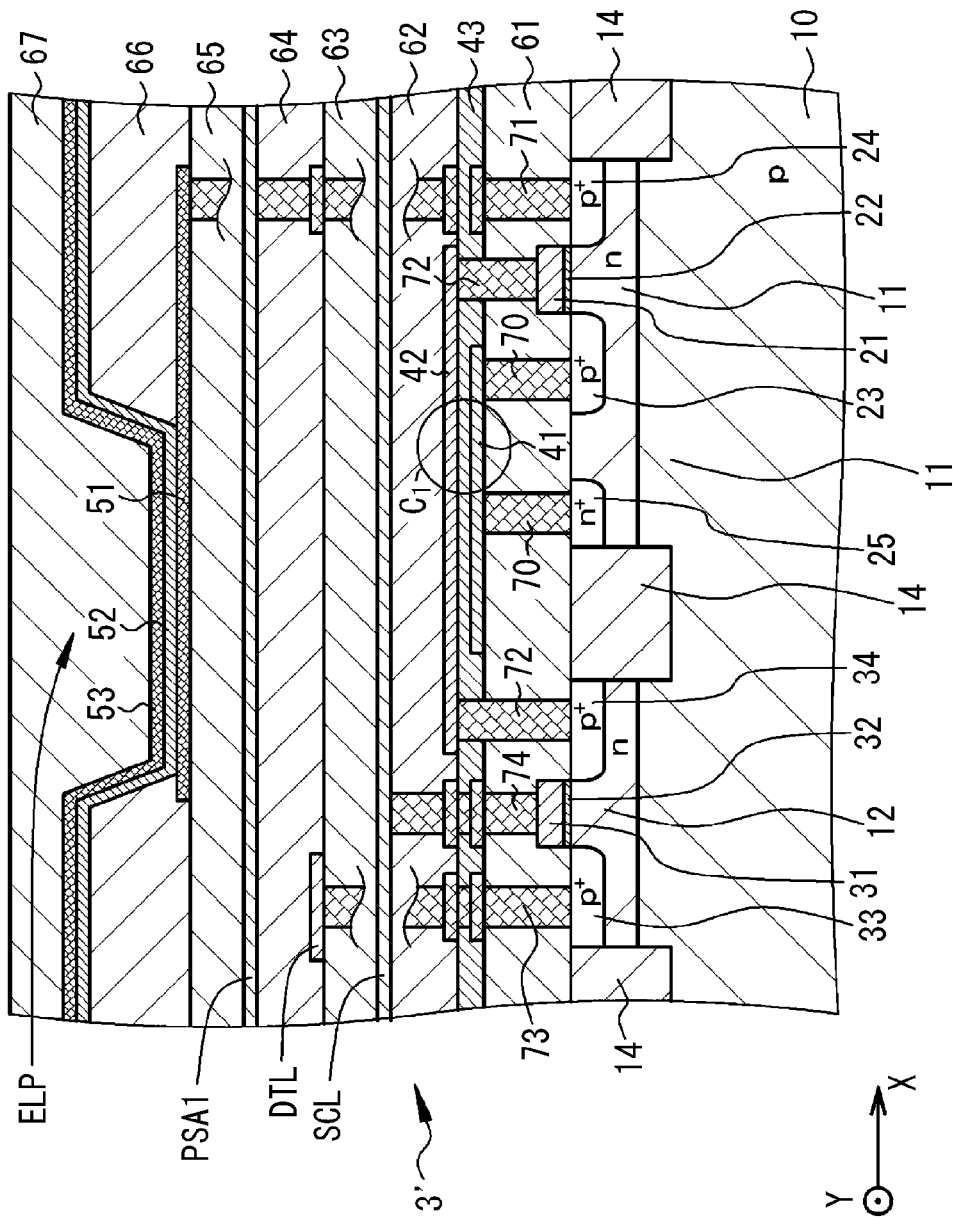
FIG. 3 is a schematic partial cross-sectional view of the display element illustrated in FIG. 2.

FIG. 2 is a conceptual diagram of a display device including a display element having a configuration different from that of the display element illustrated in FIG. 1. FIG. 3 is a schematic partial cross-sectional view of the display element illustrated in FIG. 2.

The display element 3' forming the display device 1' illustrated in FIG. 2 includes, in addition to a current driven type light emitting unit ELP, a write transistor $TR_W$, a driving transistor $TR_D$, and the capacitor $C_1$, a first light emission control transistor $TR_{EL1}$, a second light emission control transistor $TR_{EL2}$, and an auxiliary capacitor $C_2$. These transistors are provided on a silicon semiconductor substrate, for example. Each of the transistors is formed by a p-channel type field effect transistor.

In the display device 1', in addition to a scan line SCL and a data line DTL, a first light emission control line CL1 and a second light emission control line CL2 are included. These are connected to the light emission control unit 103.

Moreover, in the display device 1', instead of the feeder line PS1 illustrated in FIG. 1, a first feeder line PS1A and a second feeder line PS1B are included. The first feeder line PS1A is connected to a first power supply unit 100A and the second feeder line PS1B is connected to a second power supply unit 100B.

In the display element 3', one of source/drain regions 23 of the driving transistor $TR_D$ is connected to other one of source/drain regions 37 of the first light emission control transistor $TR_{EL1}$, and the other one of the source/drain regions 24 is connected to the light emitting unit ELP. A gate electrode 21 is connected to other one of source/drain regions 34 of the write transistor $TR_W$ and is connected to other end 42 of the capacitor $C_1$.

Further, in the write transistor $TR_W$, one of source/drain regions 33 is connected to the data line DTL, and the gate electrode 31 is connected to the scan line SCL.

In the first light emission control transistor $TR_{EL1}$, one of source/drain regions 36 is connected to the first feeder line PS1A, and the gate electrode 35 is connected to the first light emission control line CL1.

One end 41 of the capacitor $C_1$ is connected to the second feeder line PS1B via the auxiliary capacitor $C_2$ and further connected to one of the source/drain regions 23 of the driving transistor $TR_D$ and the other one of the source/drain regions 37 first light emission control transistor $TR_{EL1}$.

A gate electrode of the second light emission control transistor $TR_{EL2}$ is connected to the second light emission control line CL2, and one of source/drain regions is connected to the other one of the source/drain regions (drain region 24) of the driving transistor $TR_D$. The other one of the source/drain regions has a potential $V_{SS}$.

As illustrated in FIG. 3, each of the driving transistor $TR_D$, the write transistor $TR_W$, and the first light emission control transistor $TR_{EL1}$ is included in an n-type well formed in a p-type silicon semiconductor substrate 10. That is, these transistors are formed by a p-channel type MOSFET. The driving transistor $TR_D$ is included in a first well 11, the write transistor $TR_W$ is included in a second well 12, the first light emission control transistor $TR_{EL1}$ is included in a third well (not illustrated), and the second light emission control transistor $TR_{EL2}$ is included in a fourth well (not illustrated).

Furthermore, the one of the source/drain regions 23 of the driving transistor $TR_D$ and the n-type well (first well 11) in which the driving transistor $TR_D$ is formed are electrically connected. Specifically, as illustrated in FIG. 3, a connection region 25 having n$^+$ is included in a surface region of the first well 11. Moreover, the connection region 25 and the one of the source/drain regions 23 of the driving transistor $TR_D$ are electrically connected to each other through a contact hole 70 and wiring (specifically, the one of the electrodes 41 of the capacitor $C_1$).

The capacitor $C_1$ (illustrated by a part encircled in FIG. 3) includes the one of the electrodes (one end) 41, the other one of the electrodes (other end) 42, and a dielectric layer (insulating layer) 43 interposed between these electrodes 41 and 42.

The second well 12 has the same potential in all the display elements 3'. Specifically, the second well 12 is caused to have a predetermined potential (which is a substrate potential and the highest potential used in a driving circuit, for example) via the silicon semiconductor substrate 10. The third well is also caused to have a predetermined potential (which is a substrate potential and the highest potential used in a driving circuit, for example) via the silicon semiconductor substrate 10. The driving transistor $TR_D$, the write transistor $TR_W$, and the first light emission control transistor $TR_{EL1}$ forming each of the display elements 3' are surrounded by an element isolation region 14.

In the driving transistor $TR_D$, the one of the source/drain regions 23 is connected to the one of the electrodes 41 of the capacitor $C_1$ via the contact hole 70 and further connected to the other one of the source/drain regions 37 (not illustrated in FIG. 3) of the light emission control transistor $TR_{EL\_C}$. Furthermore, the other one of the source/drain regions 24 is connected to the first electrode 51 of the light emitting unit (organic EL light emitting unit) ELP via another contact hole and a contact pad 71. The gate electrode 21 is connected to the other one of the electrodes 42 of the capacitor $C_1$ via still another contact hole and a contact pad 72 and further connected to the other one of the source/drain regions 34 of the write transistor $TR_W$ (in the embodiment, specifically, a source/drain region which functions as the drain region 34 when an image signal is written. This similarly applies also to the following).

Furthermore, in the write transistor $TR_W$, the one of the source/drain regions 33 is connected to the data driver 102 via a contact hole, a contact pad 73, and a data line DTL. The gate electrode 31 is connected to the scanning unit 101 via yet another contact hole, a contact pad 74, and a scan line SCL.

Note that, in FIG. 3, a symbol 14 denotes an element isolation region, and symbols 22 and 32 denote a gate insulating layer. The contact holes and the contact pads 71, 72, 73, and 74 are included in such a manner as to avoid short-circuit with a scan line SCL or the first feeder line PS1A, etc. extending in a first direction, and this state is illustrated in FIG. 3.

The driving transistor $TR_D$, the write transistor $TR_W$, and the first light emission control transistor $TR_{EL1}$ (not illustrated in FIG. 3) included in the silicon semiconductor substrate 10 are covered with an interlayer insulating layer 61. Moreover, the one of the electrodes 41 of the capacitor $C_1$ and the dielectric layer (insulating layer) 43 are formed on the interlayer insulating layer 61, and the other one of the electrodes 42 of the capacitor $C_1$ is formed on the dielectric layer (insulating layer) 43. Moreover, an interlayer insulating layer 62 is formed on the dielectric layer (insulating layer) 43 and the other one of the electrodes 42 of the capacitor $C_1$, and the scan line SCL is formed on the interlayer insulating layer 62. Furthermore, an interlayer insulating layer 63 is formed on the interlayer insulating layer 62 and the scan line SCL, and the data line DTL is formed on the interlayer insulating layer 63. Furthermore, an interlayer insulating layer 64 is formed on the interlayer insulating layer 63 and the data line DTL, and the first feeder line PS1A, the second feeder line PS1B (not illustrated in FIG. 3), and the first light emission control line CL1 (not illustrated in FIG. 3) are formed on the interlayer insulating layer 64. Furthermore, an interlayer insulating layer 65 is formed on the interlayer insulating layer 64, the first feeder line PS1A, the second feeder line PS1B, and the first light emission control line CL1, and a first electrode 51 forming the light emitting unit ELP is formed on the interlayer insulating layer 65. Furthermore, on the interlayer insulating layer 65 and the first electrode 51, an interlayer insulating layer 66 having an opening in which the first electrode 51 is exposed at the bottom portion is formed, and on the interlayer insulating layer 66 and the first electrode 51, a hole transporting layer, a light emitting layer, an electron transporting layer (organic material layer 52 which is a laminated structure thereof), a second electrode 53 forming the light emitting unit ELP are formed, and an insulating layer 67 is formed on the second electrode 53. On the insulating layer 67, a glass plate (not illustrated) is adhered via an adhesive layer (not illustrated). In some cases, patterning of the organic material layer 52 and the second electrode 53 is unnecessary. An order of laminating the scan line SCL, the data line DTL, the first feeder line PS1A, the second feeder line PS1B, and the first light emission control line CL1 is not limited to the aforementioned lamination order, and essentially can be in any order. A cathode voltage $V_{Cat}$ is supplied to the second electrode 53.

Manufacturing of the aforementioned display element 3' can be carried out by a well-known method, and various materials used for manufacturing the display element 3' can be well-known materials.

An outline of operations of the display element 3' illustrated in FIG. 2 will be described. At the time of light emission, the write transistor $TR_W$ and the second light emission control transistor $TR_{EL2}$ are in a non-conduction state while the first light emission control transistor $TR_{EL1}$ is in a conduction state. A current flows through the driving transistor $TR_D$ in accordance with a voltage held in the capacitor $C_1$, and the light emitting unit ELP emits light.

From this state, the first light emission control transistor $TR_{EL1}$ is rendered non-conductive. Since the driving transistor $TR_D$ is disconnected from the first power supply unit 100A, the light emitting unit ELP is brought into a non-light emitting state. Next, the second light emission control transistor $TR_{EL2}$ is rendered conductive, and the potential of the anode electrode 51 of the light emitting unit ELP is set to $V_{SS}$. The potential $V_{SS}$ is set to a value not exceeding a threshold voltage of the light emitting unit ELP. Thereafter, the first light emission control transistor $TR_{EL1}$ is rendered conductive to supply a current via the driving transistor $TR_D$. At this time, since the anode potential of the light emitting unit ELP is the potential $V_{SS}$, the light emitting unit ELP maintains the non-light emitting state. Therefore, the current flowing through the driving transistor $TR_D$ flows to the second light emission control transistor $TR_{EL2}$.

Thereafter, a reference potential $V_{ofs}$ is applied to the gate of the driving transistor $TR_D$. The reference potential $V_{ofs}$ is, for example, applied from the data line DTL via the write transistor $TR_W$. A drive voltage is applied to the source region of the driving transistor $TR_D$, and the potential of the drain region is the potential $V_{SS}$. The reference potential $V_{ofs}$ is set such that a gate-source voltage of the driving transistor $TR_D$ is sufficiently larger than a threshold voltage $V_{th}$ of the driving transistor $TR_D$.

Thereafter, the first light emission control transistor $TR_{EL1}$ is rendered non-conductive. At this time, a current flows from the capacitor $C_1$ to the second light emission control transistor $TR_{EL2}$ via the driving transistor $TR_D$. Since the reference voltage $V_{ofs}$ is applied to the gate of the driving transistor $TR_D$, the source potential of the driving transistor $TR_D$ decreases and eventually a current flow stops when the driving transistor $TR_D$ is cut off. When the driving transistor $TR_D$ is cut off, a potential difference corresponding to the threshold voltage $V_{th}$ of the driving transistor $TR_D$ is generated between the source region and the gate electrode. This potential difference is held in the capacitor $C_1$.

Next, in a state in which a voltage corresponding to the luminance of an image to be displayed is supplied from the data driver 102 to the data line DTL, a voltage corresponding to the luminance of the image to be displayed is written in the capacitor $C_1$ via the write transistor $TR_W$ in a conducting state. When the write transistor $TR_W$ and the second light emission control transistor $TR_{EL2}$ are rendered non-conductive and the first light emission control transistor $TR_{EL1}$ is rendered conductive, a current flows in the driving transistor $TR_D$ in accordance with the voltage held in the capacitor $C_1$, and the light emitting unit ELP emits light.

The outline of the display device according to the first embodiment has been described above.

Figure 4:
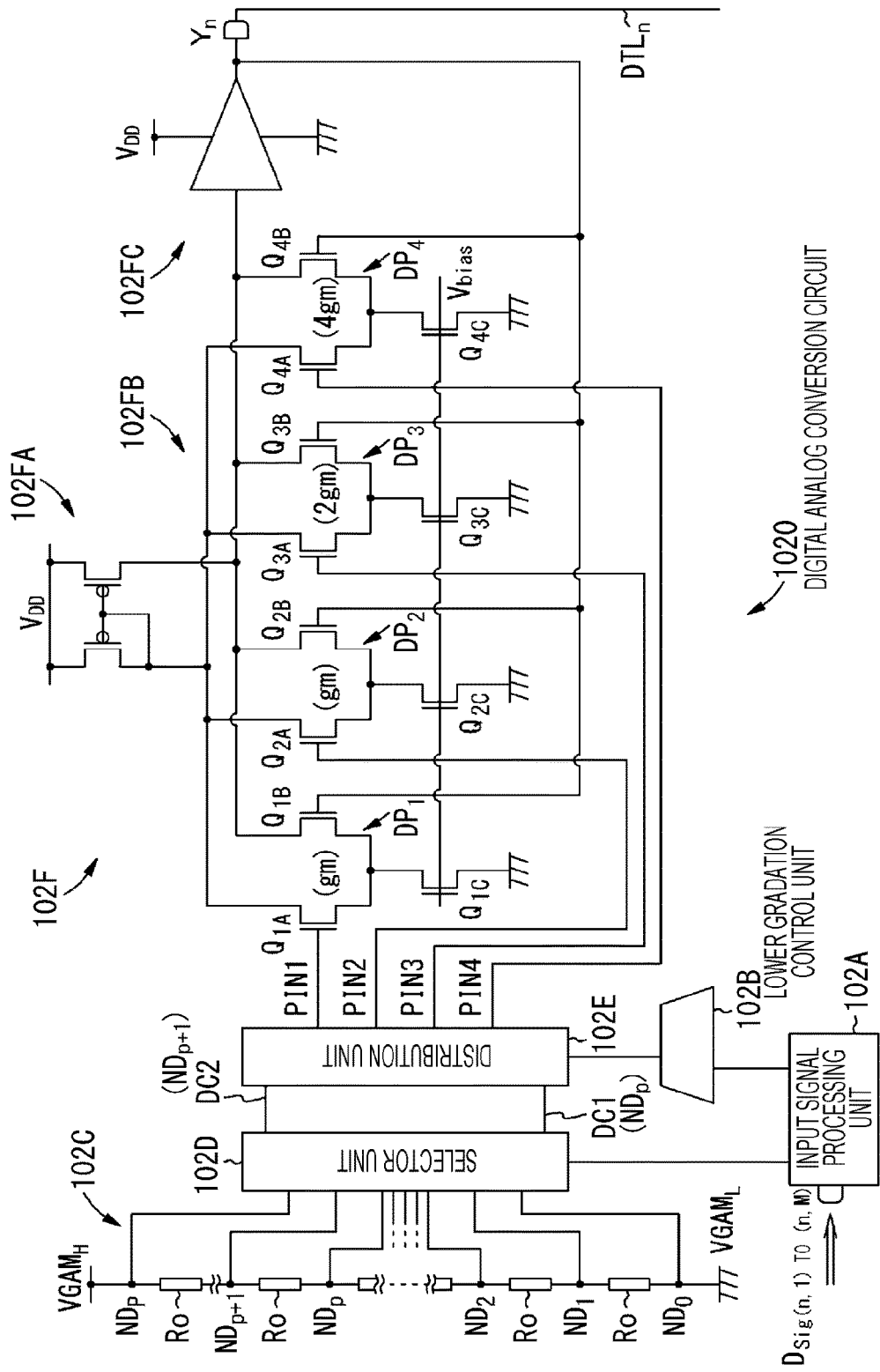
FIG. 4 is a schematic circuit diagram for explaining a configuration of a digital analog conversion circuit forming a part related to driving of an n-th data line in a data driver according to the first embodiment.

FIG. 4 is a schematic circuit diagram for explaining a configuration of a digital analog conversion circuit forming a part related to driving of the n-th data line in the data driver according to the first embodiment.

A configuration of the digital analog conversion circuit 1020 will be described in detail. The digital analog conversion circuit 1020 forming the data driver 102 includes:

a selector unit 102D which selects a plurality of nodes from the voltage dividing circuit 102C in accordance with bit information on the higher order side of an input digital signal and outputs voltages of the selected nodes; and a differential amplifier 102F including a plurality of differential pairs to which output voltages of the selector unit 102D are input.

The digital analog conversion circuit 1020 further includes an input signal processing unit 102A including a timing controller, a buffer, and other components, a lower gradation control unit 102B including a table, and a distribution unit 102E.

Digital signals $D_{sig\,(n,\,1)}$ to $D_{(n,\,M)}$ corresponding to display elements 3 in the m-th column are sequentially input to the input signal processing unit in accordance with scanning of the display panel.

The voltage dividing circuit 102C includes P resistive elements, denoted by a symbol Ro, connected in series. A reference voltage $VGAM_H$ on the high gradation side is applied to one end of the voltage dividing circuit, and a reference voltage $VGAM_L$ on the low gradation side is applied to the other end. Here, it is assumed that a relationship of the reference voltage $VGAM_H$>the reference voltage $VGAM_L$ holds. In FIG. 4, symbols $ND_0$ to $ND_P$ denote nodes of the voltage dividing circuit 102C. For convenience of description, the voltage of the node $ND_p$ (where p=0, 1, . . . , P) is represented as a voltage $ND_p$. Note that the voltage dividing circuit 102C is included as a common circuit in the data driver 102.

In the example illustrated in FIG. 4, relationships of voltage $ND_0$=reference voltage $VGAM_L$, voltage $ND_p$<voltage $ND_{p+1}$, and voltage $ND_P$=reference voltage $VGAM_H$ hold.

For convenience of explanation, it is assumed that a digital signal $D_{sig(n,\,m)}$ is input to the input signal processing unit 102A.

The input signal processing unit 102A sends the bit information of the higher order side of the digital signal $D_{sig(n,\,m)}$ to the selector unit 102D and sends bit information of the lower order side to the lower gradation control unit 102B. Specifically, information of upper nine bits out of information of twelve bits are sent to the selector unit 102D, and information of lower three bits is sent to the lower gradation control unit 102B.

The selector unit 102D selects a plurality of nodes from the voltage dividing circuit 102C in accordance with the bit information of the higher order side of the input digital signal and outputs voltages of the selected nodes.

In the first embodiment, in a case where a value indicated by the upper nine bits is "0", the node $ND_0$ and the node $ND_1$ are selected. Then, the voltage of the node $ND_0$ is output as an output voltage DC1, and the voltage of the node $ND_1$ is output as an output voltage DC2. Similarly, in a case where a value indicated by the upper nine bits is "1", the node $ND_1$ and a node $ND_2$ are selected. Then, the voltage of the node $ND_1$ is output as the output voltage DC1, and the voltage of the node $ND_2$ is output as the output voltage DC2. Similarly, in a case where a value indicated by the upper nine bits is "511", a node $ND_{511}$ and a node $ND_{512}$ are selected. Then the voltage of the node $ND_{511}$ is output as the output voltage DC1, and the voltage of the node $ND_{512}$ is outputted as the output voltage DC2.

In the digital analog conversion circuit 1020, a correspondence relationship between the output voltages of the selector unit 102D and inputs of respective differential pairs of the differential amplifier 102F is controlled in accordance with the bit information of the lower order side of the input digital signal, whereby a voltage corresponding to the digital signal is output from the differential amplifier 102F.

In the differential amplifier 102F, a plurality of differential pairs of the same polarity is connected to a common current mirror 102FA, and each of the differential pairs is driven by an individual current source. A symbol $V_{DD}$ denotes a power supply voltage.

The plurality of differential pairs may having the same mutual conductance characteristic or may be weighted on mutual conductance characteristics. The latter configuration has an advantage that the number of differential pairs for gradation display can be smaller than that of the former.

In FIG. 4, a group of differential pairs 102FB includes a first differential pair $DP_1$, a second differential pair $DP_2$, a third differential pair $DP_3$, and a fourth differential pair $DP_4$ ratios of weighting on mutual conductance characteristics of which are 1:1:2:4. Each of the differential pairs is formed by a field effect transistor.

The first differential pair $DP_1$ is formed by a transistor $Q_{1C}$ in addition to a pair of transistors $Q_{1A}$ and $Q_{1B}$, and the second differential pair $DP_2$ is formed by a transistor $Q_{2C}$ in addition to a pair of transistors $Q_{2A}$ and $Q_{2B}$. Similarly, the third differential pair $DP_3$ is formed by a transistor $Q_{3C}$ in addition to a pair of the transistors $Q_{3A}$ and $Q_{3B}$, and the fourth differential pair $DP_4$ is formed by a transistor $Q_{4C}$ in addition to a pair of the transistors $Q_{4A}$ and $Q_{4B}$.

A symbol 102FC denotes an amplifier forming the final stage of the differential amplifier 102F. An output terminal Yn of the amplifier 102FC is connected to gates of the transistors $Q_{1B}$, $Q_{2B}$, $Q_{3B}$ and $Q_{4B}$ forming the differential pairs and the data line $DTL_n$ of the display panel. Furthermore, a predetermined common voltage $V_{bias}$ is applied to the gates of the transistors $Q_{1C}$, $Q_{2C}$, $Q_{3C}$, and $Q_{4C}$ forming the differential pairs.

Inputs of the differential pairs are formed by gates of the transistors $Q_{1A}$, $Q_{2A}$, $Q_{3A}$, and $Q_{4A}$ forming the differential pairs. Weighting of the mutual conductance characteristics in the respective differential pairs can be performed, for example, by weighting the sizes of transistors forming the differential pairs.

In the digital analog conversion circuit 1020, a correspondence relationship between the output voltages of the selector unit 102D and inputs of respective differential pairs of the differential amplifier 102F is controlled in accordance with the bit information of the lower order side of the input digital signal, whereby a voltage corresponding to the digital signal is output from the differential amplifier 102F.

The distributing unit 102E controls a correspondence relationship between the output voltages (DC1 and DC2) of the selector unit 102D and inputs (PIN1, PIN2, PIN3, and PIN4) of the respective differential pairs of the differential amplifier 102F in accordance with the bit information of the lower order side of the input digital signal.

Here, in order to facilitate understanding of the present disclosure, operations and disadvantages will be described on the digital analog conversion circuit of the reference example excluding the lower gradation control unit 102B from FIG. 4.

Figure 5:
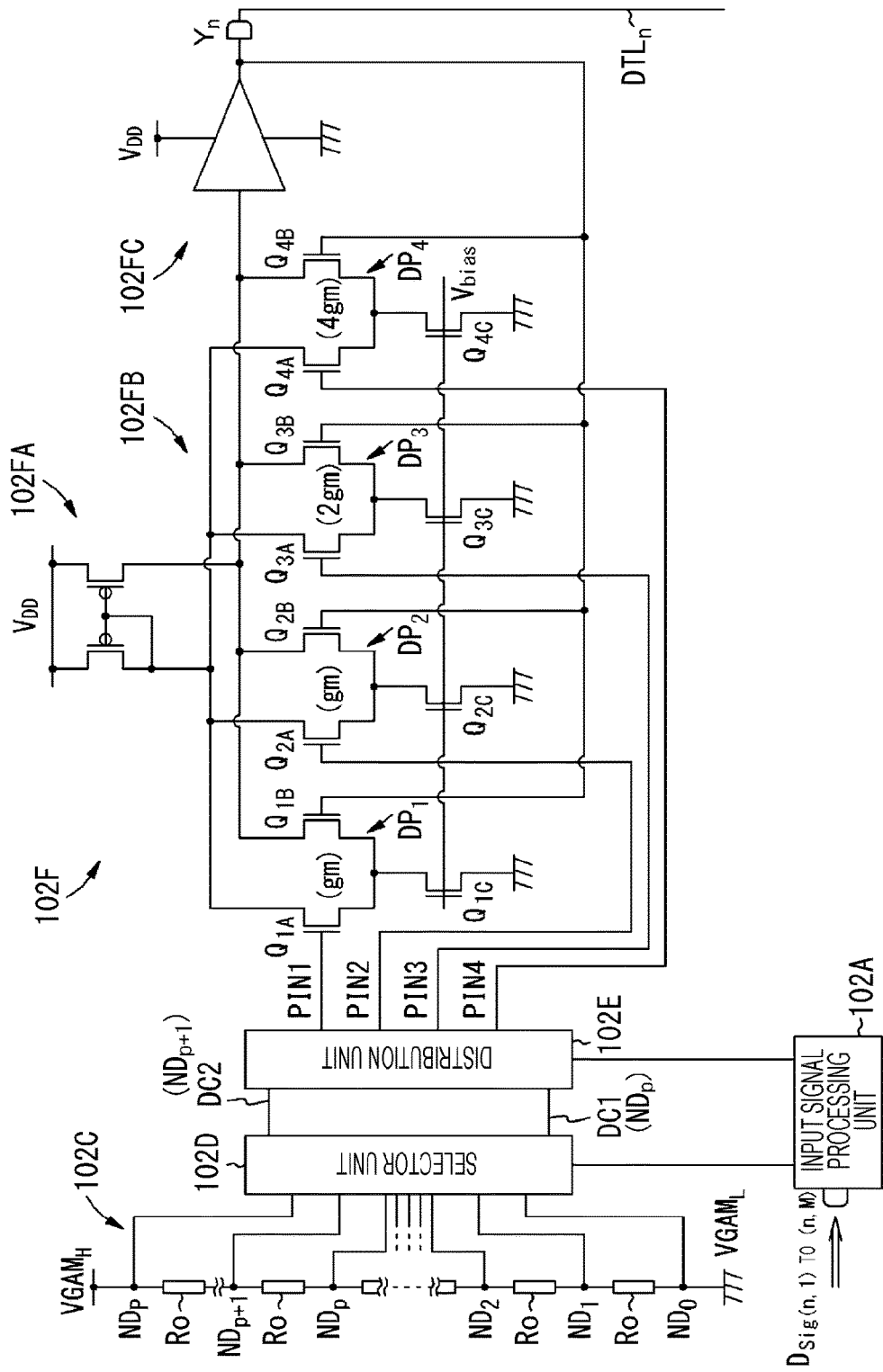
FIG. 5 is a schematic circuit diagram for explaining a configuration of a digital analog conversion circuit of a reference example forming a part related to driving of an n-th data line.

FIG. 5 is a schematic circuit diagram for explaining a configuration of a digital analog conversion circuit of a reference example forming a part related to driving of the n-th data line.

In a configuration illustrated in FIG. 5, the correspondence relationship between the output voltages DC1 and DC2 of the selector unit 102D and the inputs PIN1, PIN2, PIN3, and PIN4 of the respective differential pairs of the differential amplifier 102F is controlled on the basis of information of lower three bits of the digital signal $D_{sig(n, m)}$ sent to the distribution unit 102E from the Input signal processing unit 102A.

FIG. 6A is a table for explaining the relationship between lower three bits of an input signal and voltages input to the respective differential pairs in the digital analog conversion circuit of the reference example.

In a case where the lower three bits are [000], it is only required that the output voltages DC1 and DC2 of the selector unit 102D and the inputs PIN1, PIN2, PIN3, and PIN4 of the respective differential pairs of the differential amplifier 102F correspond to each other such that an output from the differential amplifier 102F becomes the lowest. Specifically, the output voltage DC1 is allowed to correspond to all of the inputs PIN1, PIN2, PIN3, and PIN4 of the respective differential pairs.

Meanwhile, in a case where the lower three bits are [001] to [111], it is only required that the output voltages DC1 and DC2 and the inputs PIN1, PIN2, PIN3, and PIN4 of the respective differential pairs of the differential amplifier 102F correspond to each other such that an output from the differential amplifier 102F gradually increases.

From the above results, in the example illustrated in FIG. 5, the relationship between the lower three bits of an input signal and voltages input to the respective differential pairs is expressed as illustrated in FIG. 6A.

Here, a load when the group of differential pairs 102FB is driven is considered. A case where the largest load is applied to driving of the group of differential pairs 102FB is a case where the four differential pairs are driven by the same voltage, particularly a case where the four differential pairs are driven by the output voltage DC1. Therefore, as illustrated in FIG. 6B, when the lower three bits are [000], settling time becomes the longest.

On the other hand, a case where the smallest load is applied to driving of the group of differential pairs 102FB is a case where the fourth differential pair $DP_4$ having a large weighting of mutual conductance characteristics is driven using the high output voltage DC2 while the other driving pairs are driven by the output voltage DC1. Therefore, in a case where the lower three bits are [100], settling time becomes the shortest.

Figure 7:
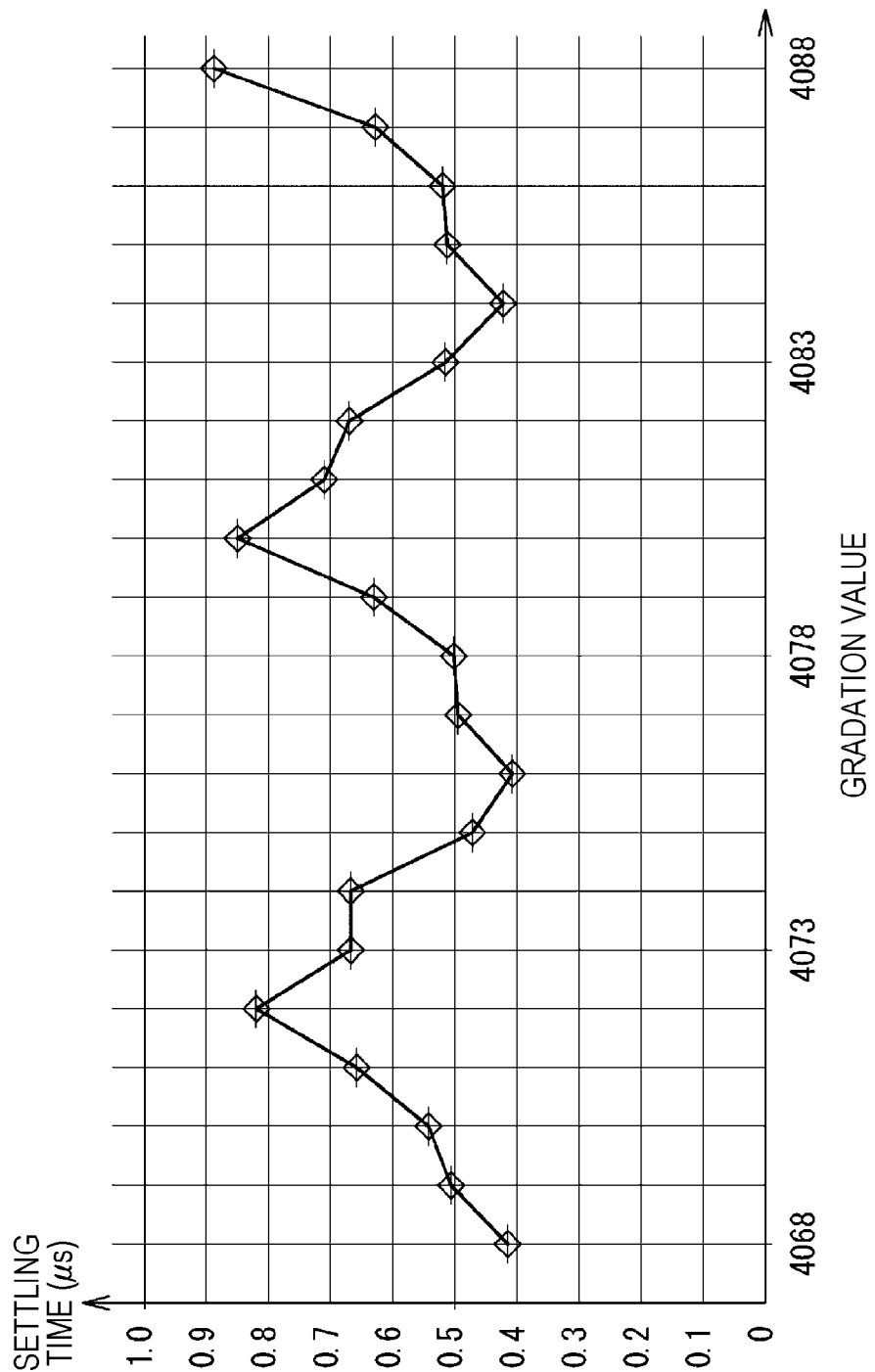
FIG. 7 is a schematic graph illustrating the relationship between gradation values and settling time in a data driver using the digital analog conversion circuit of the reference example.

Therefore, settling time periodically varies for every lower three bits of an input signal. Specifically, as illustrated in FIG. 7, there is a disadvantage that settling time varies for every eight gradation periods.

Therefore, in the first embodiment illustrated in FIG. 4, when a voltage corresponding to a digital signal is output, the correspondence relationship between the output voltages of the selector unit 102D and the inputs of the respective differential pairs of the differential amplifier 102F is allowed to have short settling time, and then the correspondence relationship between the output voltages of the selector unit 102D and the inputs of respective differential pairs of the differential amplifier 102F is controlled in accordance with the bit information of the lower order side of the input digital signal. The lower gradation control unit 102B is used for performing the aforementioned control.

In the first embodiment, the information of the lower three bits of the digital signal $D_{sig(n, m)}$ is sent from the input signal processing unit 102A to the lower gradation control unit 102B. Moreover, operations of the distribution unit 102E is controlled by the lower gradation control unit 102B.

Figure 8:
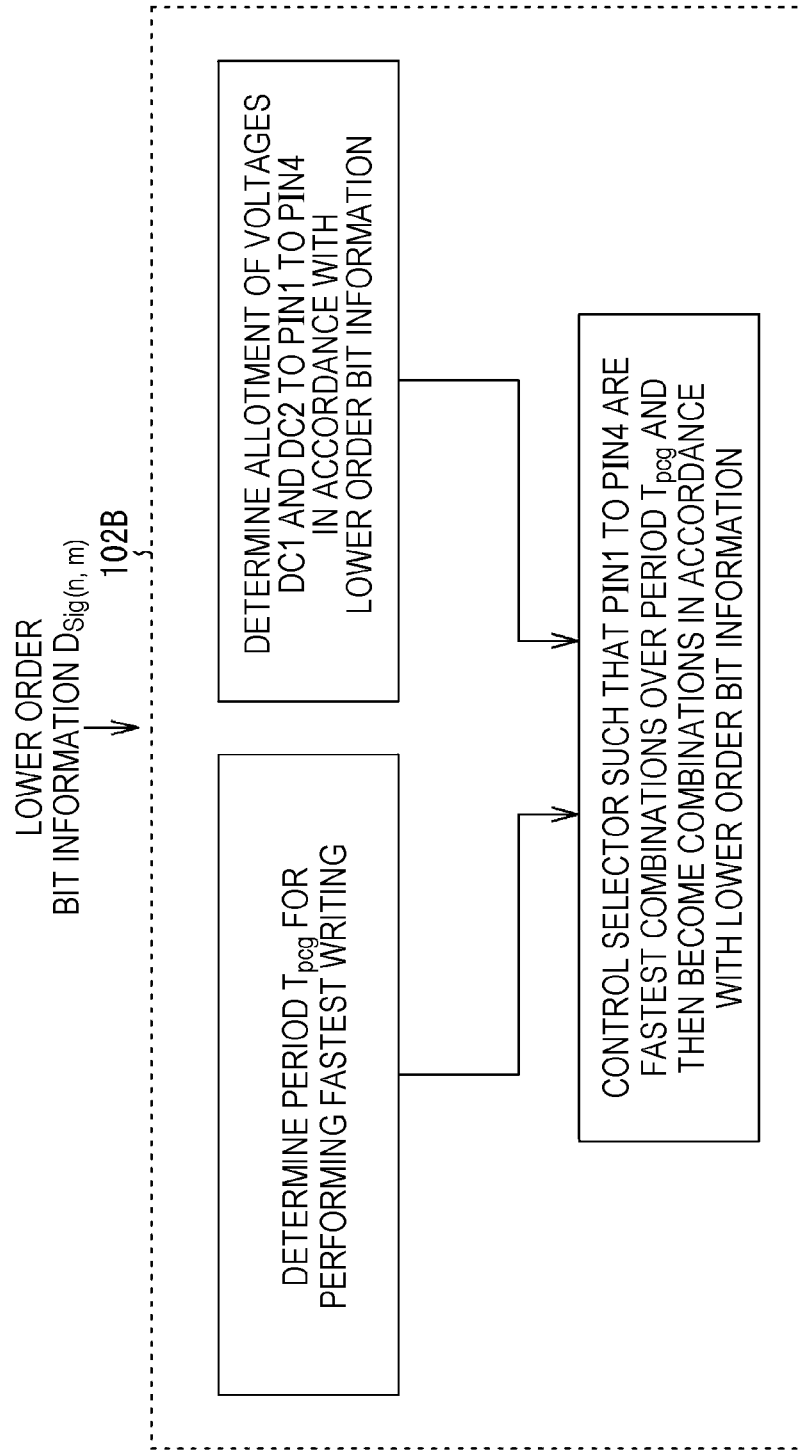
FIG. 8 is a diagram for explaining operations of a lower gradation control circuit according to the first embodiment.

FIG. 8 is a diagram for explaining operations of a lower gradation control circuit according to the first embodiment.

The lower gradation control unit 102B determines a period $T_{pcg}$ in which the fastest writing is performed, more specifically, the writing of the lower three bits [100] with which settling time becomes the shortest and allows the output voltages DC1 and DC2 and the inputs PIN1, PIN2, PIN3, and PIN4 of the respective differential pairs of the differential amplifier 102F to correspond to each other in accordance with of the information of the lower three bits of the digital signal $D_{sig(n, m)}$. The correspondence relationship of the latter is similar to that illustrated in FIG. 6A.

Then, during the period $T_{pcg}$, the correspondence relationship between the output voltages DC1 and DC2 and the inputs PIN1, PIN2, PIN3, and PIN4 of respective differential pairs of the differential amplifier 102F is set to have the fastest settling time, more specifically, as illustrated in FIG. 6C. Thereafter, the distribution unit 102E is controlled such that the correspondence relationship between the output voltages DC1 and DC2 and the inputs PIN1, PIN2, PIN3, and PIN4 of the respective differential pairs of the differential amplifier 102F is in accordance with the information of the lower three bits of the digital signal $D_{sig(n, m)}$.

Here, the period $T_{pcg}$ in which the correspondence relationship between the output voltages of the selector unit 102D and the inputs of the respective differential pairs of the differential amplifier 102F is set to have short settling time may be set at a predetermined constant length, or may be controlled of the length in accordance with the bit information of the lower order side of the input digital signal. For example, the lower gradation control unit 102B may be controlled by referring to a table storing the length of the period $T_{pcg}$ corresponding to the lower three bits.

Alternatively, from the perspective of scanning the display device, the period $T_{pcg}$ may be set to have a certain ratio to a scanning period in the display panel. Alternatively, the ratio to a scanning period may be controlled in accordance with the bit information on the lower order side of the input digital signal. Although it depends on a configuration of the display device, the ratio of the period $T_{pcg}$ to the scanning period is preferably about 10% to 50%.

Figure 9:
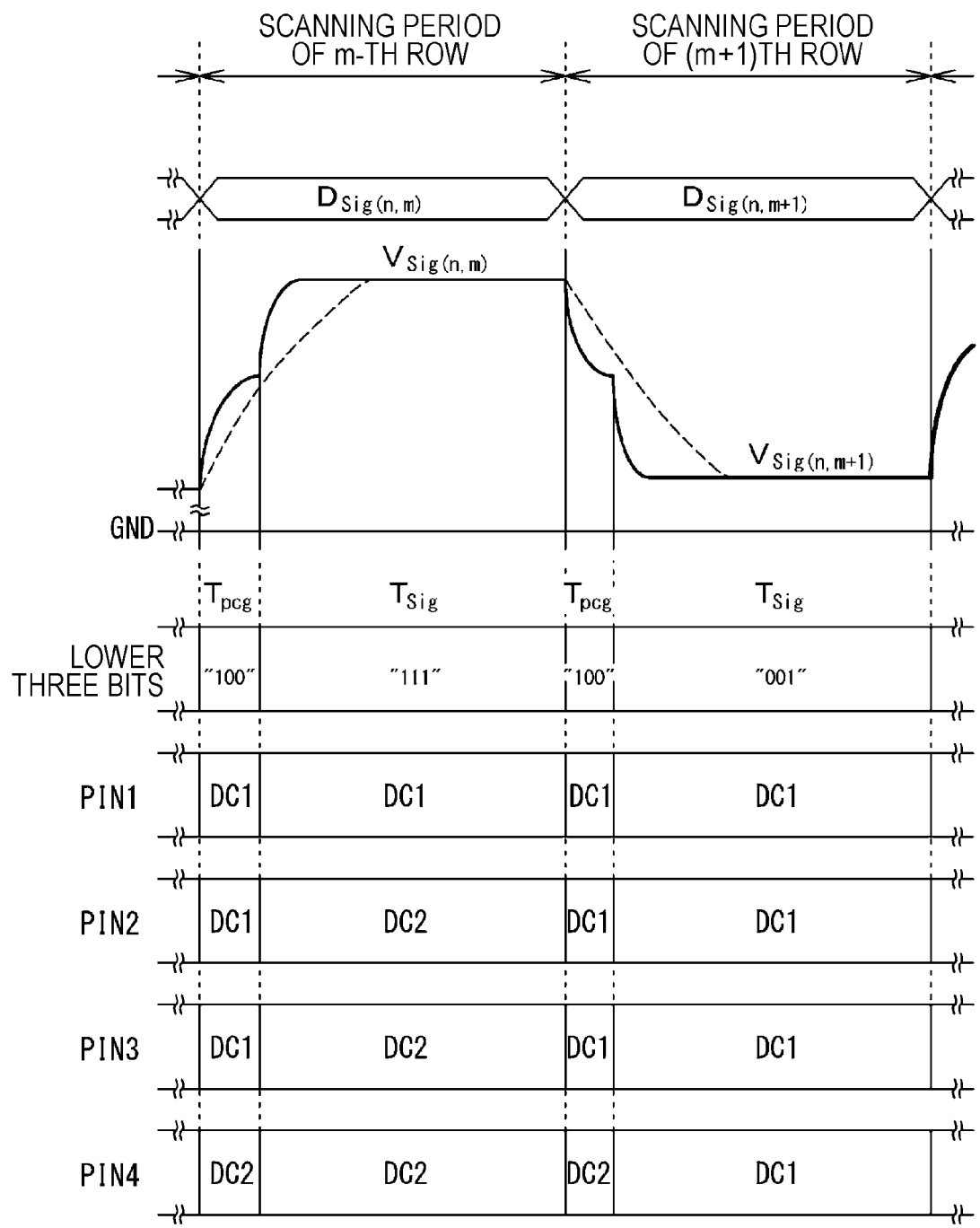
FIG. 9 is a schematic graph for explaining operations of a data driver in a scanning period of an m-th row and a scanning period of an (m+1)th row.

FIG. 9 is a schematic graph for explaining operations of the data driver in a scanning period of an m-th row and a scanning period of an (m+1)th row.

This graph illustrates operations when writing of the lower gradation [111] is performed in a scanning period of the m-th row and writing of the lower gradation [001] is performed in a scanning period of the (m+1)th row in a case where the output voltage DC1 is the voltage $ND_p$ and the output voltage DC2 is a voltage $ND_{p+1}$.

In the scanning period of the m-th row, the gradation [100] is written over the period $T_{pcg}$ from the beginning thereof, and then the lower gradation [111] is written. A broken line represents a graph in a case where the lower gradation [111] is written over the entire scanning period without writing in the period $T_{pcg}$. Similarly, in the scanning period of the (m+1)th row, the gradation [100] is written over the period $T_{pcg}$ from the beginning thereof, and then the lower gradation [001] is written. A broken line represents a graph in a case where the lower gradation [001] is written over the entire scanning period without writing in the period $T_{pcg}$.

As illustrated in FIG. 9, a time length until a voltage $V_{sig(n, m)}$ corresponding to the digital signal $D_{sig(n, m)}$ is reached or a voltage $V_{sig(n, m+1)}$ corresponding to the digital signal $D_{sig(n, m+1)}$ is reached is shortened by performing writing over the period $T_{pcg}$. As a result, settling time can be shortened, and as a result, the periodic variations of settling time is mitigated.

In verification of the circuit simulation, settling time varied in the range of 400 to 800 [nS] in a circuit of the conventional configuration. In contrast to this, in the configuration of the present disclosure, a result that variations in settling time are kept within the range of 400 to 480 [nS] was obtained.

The first embodiment has been described above.

In the above description, it has been described that the selector unit 102D selects two nodes of the voltage dividing circuit 102C, more specifically, the node $ND_p$ and the node $ND_{p+1}$ adjacent to each other; however, this is merely an example. For example, it is possible to select nodes separated apart. Alternatively, although it depends on the configuration of the distribution unit 102E, the selector unit 102D may select three or more nodes.

Moreover, in the example illustrated in FIG. 9, it has been described that the gradation [100] is uniformly written in the period $T_{pcg}$. However, in accordance with a value of the lower three bits of the digital signal $D_{sig(n, m)}$, gradation to be written in the period $T_{pcg}$ may be changed.

[Electronic Apparatus]

The display device of the present disclosure described above can be used as a display unit (display device) of electronic apparatuses in all fields for displaying, as an image or a video, video signals input to the electronic apparatuses or video signals generated in electronic apparatuses. For example, the display device can be used as a display unit of a television set, a digital still camera, a laptop personal computer, a mobile terminal device such as a cellular phone, a video camera, a head mounted display (display of a head mounted type), etc.

The display device of the present disclosure also includes a display device of a sealed module form.

Examples include a display module formed by attaching an opposing unit such as a transparent glass to a pixel array unit. Note that the display module may include a circuit unit for inputting and outputting signals from the outside to the pixel array unit, a flexible printed circuit (FPC), or other components. Hereinafter, a digital still camera and a head mounted display will be exemplified as specific examples of electronic apparatus using the display device of the present disclosure. However, specific examples described here are merely examples, and the present disclosure is not limited thereto.

SPECIFIC EXAMPLE 1

Figure 10A:
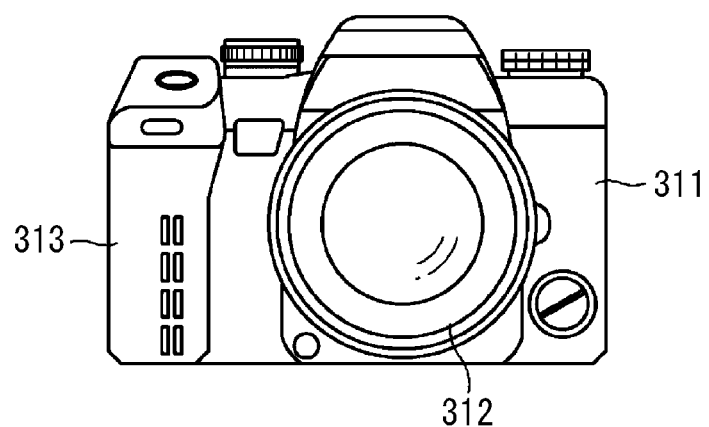
FIGS. 10A and 10B are external views of a digital still camera of a lens interchangeable single lens reflex type.
Figure 10B:
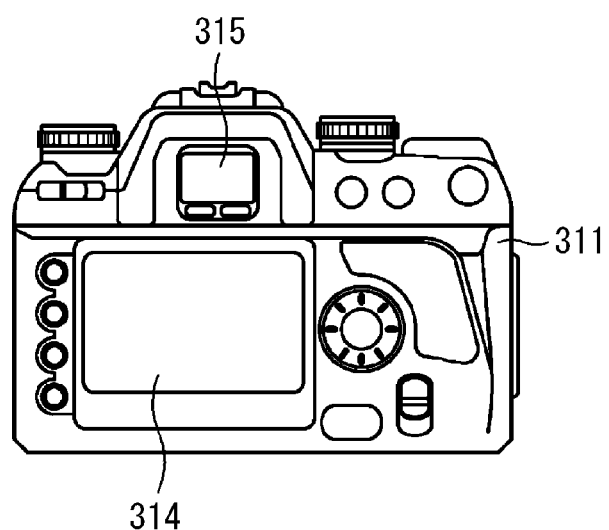

FIGS. 10A and 10B are external views of a digital still camera of a lens interchangeable single lens reflex type, and FIG. 10A is a front view thereof, and FIG. 10B is a rear view thereof. A digital still camera of a lens interchangeable single lens reflex type has, for example, an interchangeable shooting lens unit (interchangeable lens) 312 on the front right side of the camera main body unit (camera body) 311 and a grip portion 313 on the front left side for a user to hold the camera.

In addition, a monitor 314 is further included substantially at the center of a rear surface of the camera main body unit 311. A view finder (eyepiece window) 315 is included above the monitor 314. A user can visually recognize an optical image of a subject guided from the shooting lens unit 312 by looking into the view finder 315 and determine the composition.

In the digital still camera of the lens interchangeable single lens reflex type having the above structure, the display device of the present disclosure can be used as the view finder 315. That is, the digital still camera of the interchangeable lens single lens reflex type according to this example is manufactured by using the display device of the present disclosure as the view finder 315 thereof.

SPECIFIC EXAMPLE 2

Figure 11:
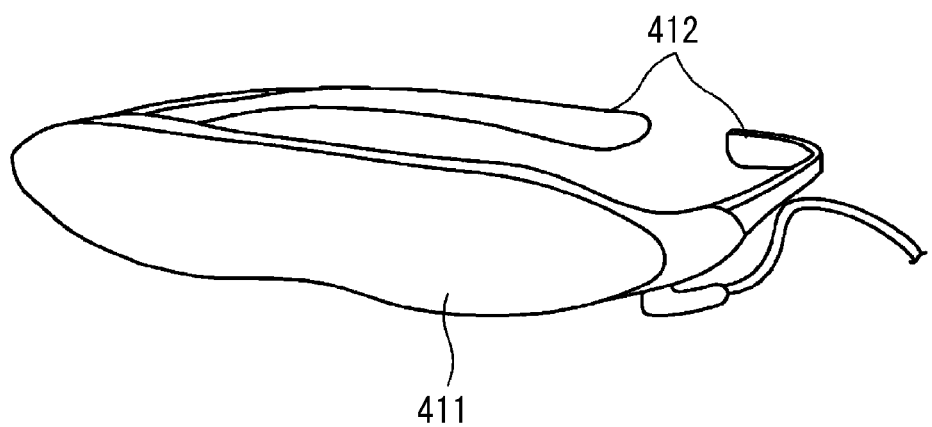
FIG. 11 is an external view of a head mounted display.

FIG. 11 is an external view of a head mounted display. The head mount display has, for example, ear hooking portions 412 for mounting to the head of a user on both sides of a glasses-shaped display unit 411. In this head mounted display, the display device of the present disclosure can be used as the display unit 411. That is, the head mounted display according to the present example is manufactured by using the display device of the present disclosure as the display unit 411.

SPECIFIC EXAMPLE 3

Figure 12:
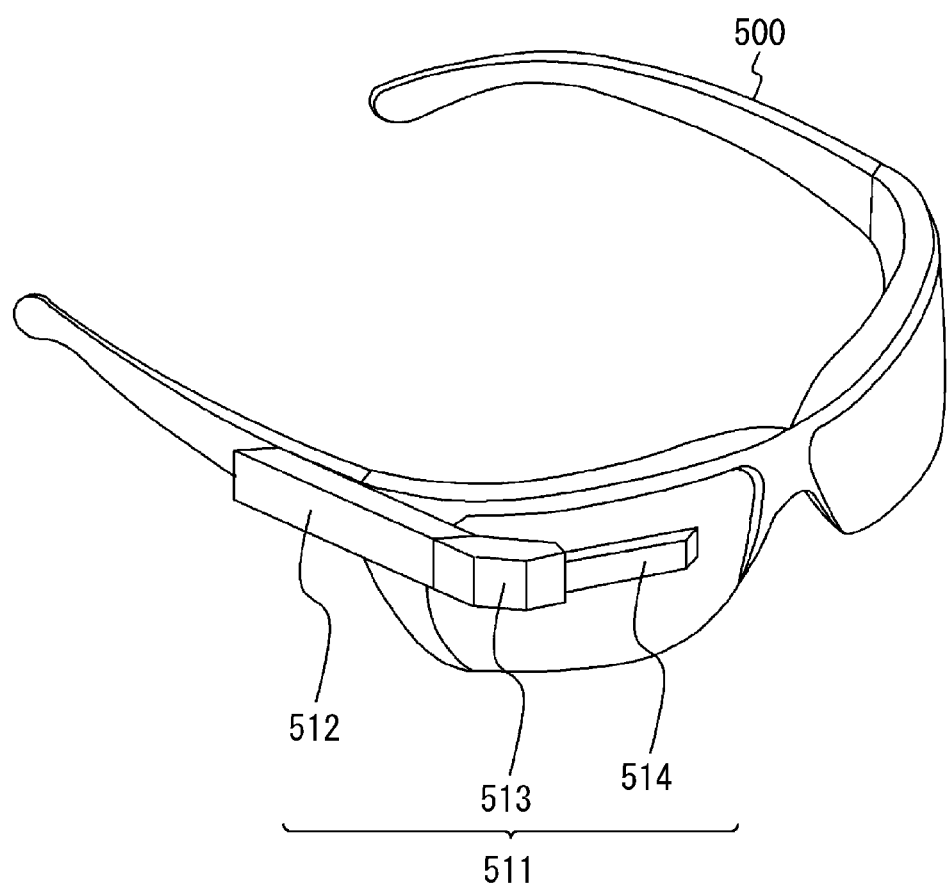
FIG. 12 is an external view of a see-through head mounted display.

FIG. 12 is an external view of a see-through head mounted display. A see-through head mounted display 511 includes a main body unit 512, an arm 513, and a lens barrel 514.

The main body unit 512 is connected to the arm 513 and eyeglasses 500. Specifically, an end portion in the long side direction of the main body unit 512 is coupled to the arm 513, and one side of a side surface of the main body unit 512 is coupled to the eyeglasses 500 via a connection member. Note that the main body unit 512 may be directly mounted to the head of a human body.

The main body unit 512 incorporates a control board for controlling operations of the see-through head mounted display 511 and a display unit. The arm 513 connects the main body unit 512 and the lens barrel 514 and supports the lens barrel 514. Specifically, the arm 513 is coupled to each of an end portion of the main body unit 512 and an end portion of the lens barrel 514 and fixes the lens barrel 514. Furthermore, the arm 513 incorporates a signal line for communicating data related to an image provided from the main body unit 512 to the lens barrel 514.

The lens barrel 514 projects image light provided from the main body unit 512 via the arm 513 toward the eyes of a user wearing the see-through head mounted display 511 through an eyepiece. In the see-through head mounted display 511, the display device of the present disclosure can be used as the display unit of the main body unit 512.

[Others]

Note that the technique of the present disclosure may have configurations as follows.

[1]

A digital analog conversion circuit, including:

a selector unit which selects a plurality of nodes from a voltage dividing circuit in accordance with bit information of a higher order side of an input digital signal and outputs voltages of the selected nodes; and a differential amplifier including a plurality of differential pairs to which the output voltages of the selector unit are input, a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier, in which, when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

[2]

The digital analog conversion circuit according to the item [1], in which the plurality of differential pairs have the same mutual conductance characteristic.

[3]

The digital analog conversion circuit according to the item [1], in which the plurality of differential pairs is weighted to a mutual conductance characteristic.

[4]

The digital analog conversion circuit according to the item [3], in which the differential amplifier includes a first differential pair, a second differential pair, a third differential pair, and a fourth differential pair ratios of weighting on a mutual conductance characteristic of which are 1:1:2:4, and in the correspondence relationship having short settling time between the output voltages of the selector unit and the inputs of the respective differential pairs of the differential amplifier, a voltage of one of two nodes selected by the selector unit is input to the fourth differential pair, and a voltage of the other one is input to the first differential pair, the second differential pair, and the third differential pair.

[5]

The digital analog conversion circuit according to any one of the items [1] to [4], in which a period, in which the correspondence relationship between the output voltages of the selector unit and the inputs of the respective differential pairs of the differential amplifier is allowed to have a short settling time, is set to a predetermined length.

[6]

The digital analog conversion circuit according to any one of the items [1] to [4], in which a length of a period, in which the correspondence relationship between the output voltages of the selector unit and the inputs of the respective differential pairs of the differential amplifier is allowed to have a short settling time, is controlled in accordance with the bit information of the lower order side of the input digital signal.

[7]

A data driver used for driving a display panel, the data driver including:

a selector unit which selects a plurality of nodes from a voltage dividing circuit in accordance with bit information of a higher order side of an input digital signal and outputs voltages of the selected nodes; and a differential amplifier including a plurality of differential pairs to which the output voltages of the selector unit are input, in which a correspondence relationship between the output voltages of the selector unit and inputs of the respective differential pairs of the differential amplifier is controlled in accordance with bit information of a lower order side of the input digital signal, whereby a voltage corresponding to the digital signal is output from the differential amplifier, and when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

[8]

The data driver according to the item [7], in which the plurality of differential pairs have the same mutual conductance characteristic.

[9]

The data driver according to the item [7], in which the plurality of differential pairs is weighted to a mutual conductance characteristic.

[10]

The data driver according to the item [9], in which the differential amplifier includes a first differential pair, a second differential pair, a third differential pair, and a fourth differential pair ratios of weighting on a mutual conductance characteristic of which are 1:1:2:4, and in the correspondence relationship having short settling time between the output voltages of the selector unit and the inputs of the respective differential pairs of the differential amplifier, a voltage of one of two nodes selected by the selector unit is input to the fourth differential pair, and a voltage of the other one is input to the first differential pair, the second differential pair, and the third differential pair.

[11]

The data driver according to any one of the items [7] to [10], in which a period, in which the correspondence relationship between the output voltages of the selector unit and the inputs of the respective differential pairs of the differential amplifier is allowed to have a short settling time, is set to a predetermined length.

[12]

The data driver according to any one of the items [7] to [10], in which a length of a period, in which the correspondence relationship between the output voltages of the selector unit and the inputs of the respective differential pairs of the differential amplifier is allowed to have a short settling time, is controlled in accordance with the bit information of the lower order side of the input digital signal.

[13]

A display device, including:

a display panel; and a data driver used for driving the display panel, in which the data driver includes:

a selector unit which selects a plurality of nodes from a voltage dividing circuit in accordance with bit information of a higher order side of an input digital signal and outputs voltages of the selected nodes; and a differential amplifier including a plurality of differential pairs to which the output voltages of the selector unit are input, a correspondence relationship between the output voltages of the selector unit and inputs of the respective differential pairs of the differential amplifier is controlled in accordance with bit information of a lower order side of the input digital signal, whereby a voltage corresponding to the digital signal is output from the differential amplifier, and when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

[14]

The display device according to the item [13], in which the plurality of differential pairs have the same mutual conductance characteristic.

[15]

The display device according to the item [13], in which the plurality of differential pairs is weighted to a mutual conductance characteristic.

[16]

The display device according to the item [15], in which the differential amplifier includes a first differential pair, a second differential pair, a third differential pair, and a fourth differential pair ratios of weighting on a mutual conductance characteristic of which are 1:1:2:4, and in the correspondence relationship having short settling time between the output voltages of the selector unit and the inputs of the respective differential pairs of the differential amplifier, a voltage of one of two nodes selected by the selector unit is input to the fourth differential pair, and a voltage of the other one is input to the first differential pair, the second differential pair, and the third differential pair.

[17]

The display device according to any one of the items [13] to [16], in which a period, in which the correspondence relationship between the output voltages of the selector unit and the inputs of the respective differential pairs of the differential amplifier is allowed to have a short settling time, is set to a predetermined length.

[18]

The display device according to any one of the items [13] to [16], in which a length of a period, in which the correspondence relationship between the output voltages of the selector unit and the inputs of the respective differential pairs of the differential amplifier is allowed to have a short settling time, is controlled in accordance with the bit information of the lower order side of the input digital signal.

[19]

An electronic apparatus including a display device, in which the display device includes:

a display panel; and a data driver used for driving the display panel, the data driver includes:

a selector unit which selects a plurality of nodes from a voltage dividing circuit in accordance with bit information of a higher order side of an input digital signal and outputs voltages of the selected nodes; and a differential amplifier including a plurality of differential pairs to which the output voltages of the selector unit are input, a correspondence relationship between the output voltages of the selector unit and inputs of the respective differential pairs of the differential amplifier is controlled in accordance with bit information of a lower order side of the input digital signal, whereby a voltage corresponding to the digital signal is output from the differential amplifier, and when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

[20]
The electronic apparatus according to the item [19],
in which the plurality of differential pairs have the same mutual conductance characteristic.

[21]
The electronic apparatus according to the item [19],
in which the plurality of differential pairs is weighted to a mutual conductance characteristic.

[22]
The electronic apparatus according to the item [21],
in which the differential amplifier includes a first differential pair, a second differential pair, a third differential pair, and a fourth differential pair ratios of weighting on a mutual conductance characteristic of which are 1:1:2:4, and
in the correspondence relationship having short settling time between the output voltages of the selector unit and the inputs of the respective differential pairs of the differential amplifier, a voltage of one of two nodes selected by the selector unit is input to the fourth differential pair, and a voltage of the other one is input to the first differential pair, the second differential pair, and the third differential pair.

[23]
The electronic apparatus according to any one of the items [19] to [22],
in which a period, in which the correspondence relationship between the output voltages of the selector unit and the inputs of the respective differential pairs of the differential amplifier is allowed to have a short settling time, is set to a predetermined length.

[24]
The electronic apparatus according to any one of the items [19] to [22],
in which a length of a period, in which the correspondence relationship between the output voltages of the selector unit and the inputs of the respective differential pairs of the differential amplifier is allowed to have a short settling time, is controlled in accordance with the bit information of the lower order side of the input digital signal.

[25]
A driving method of a digital analog conversion circuit, the digital analog conversion circuit including:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier,
in which, when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

[26]
The driving method of the digital analog conversion circuit according to the item [25],
in which a period, in which the correspondence relationship between the output voltages of the selector unit and the inputs of the respective differential pairs of the differential amplifier is allowed to have a short settling time, is set to a predetermined length.

[27]
The driving method of the digital analog conversion circuit according to the item [25],
in which a length of a period, in which the correspondence relationship between the output voltages of the selector unit and the inputs of the respective differential pairs of the differential amplifier is allowed to have a short settling time, is controlled in accordance with the bit information of the lower order side of the input digital signal.

[28]
A driving method of a data driver for a display panel, the data driver including:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier,
in which, when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal of respective differential pairs of the amplifier.

[29]
The driving method of the data driver according to the item [28],
in which a period, in which the correspondence relationship between the output voltages of the selector unit and the inputs of the respective differential pairs of the differential amplifier is allowed to have a short settling time, is set to have a certain ratio to a scanning period in the display panel.

[30]
The driving method of the data driver according to the item [28],
in which a ratio, to a scanning period in the display panel, of a period in which the correspondence relationship between the output voltages of the selector unit and the inputs of the respective differential pairs of the differential amplifier is allowed to have a short settling time is controlled in accordance with the bit information of the lower order side of the input digital signal.

[31]

A driving method of a display device, the display device including:
a display panel; and
a data driver used for driving the display panel,
the data driver including:
a selector unit which selects a plurality of nodes from a voltage dividing circuit in accordance with bit information of a higher order side of an input digital signal and outputs voltages of the selected nodes; and
a differential amplifier including a plurality of differential pairs to which the output voltages of the selector unit are input,
a correspondence relationship between the output voltages of the selector unit and inputs of the respective differential pairs of the differential amplifier being controlled in accordance with bit information of a lower order side of the input digital signal, whereby a voltage corresponding to the digital signal being output from the differential amplifier,
in which, when the voltage corresponding to the digital signal is output, after the correspondence relationship between the output voltages of the selector unit and the inputs of the respective differential pairs of the differential amplifier is allowed to have a short settling time, the correspondence relationship between the output voltages of the selector unit and the inputs of the respective differential pairs of the differential amplifier is controlled in accordance with the bit information of the lower order side of the input digital signal.

[32]

The driving method of the display device according to the item [31],
in which a period, in which the correspondence relationship between the output voltages of the selector unit and the inputs of the respective differential pairs of the differential amplifier is allowed to have a short settling time, is set to have a certain ratio to a scanning period in the display panel.

[33]

The driving method of the display device according to the item [31],
in which a ratio, to a scanning period in the display panel, of a period, in which the correspondence relationship between the output voltages of the selector unit and the inputs of the respective differential pairs of the differential amplifier is allowed to have a short settling time is controlled in accordance with the bit information of the lower order side of the input digital signal.

REFERENCE SIGNS LIST 1, 1' Display device
2 Display panel
3, 3' Display element
10 Semiconductor substrate
11 First well
12 Second well
13 Element isolation region
21 Gate electrode of driving transistor
22 Gate insulating layer of driving transistor
23 One of source/drain regions of driving transistor
24 The other one of source/drain regions of the driving transistor
25 Connection region
26 Conductive material layer
28, 38 Gate side wall
31 Gate electrode of write transistor
32 Gate insulating layer of write transistor
33 One of source/drain regions of write transistor
34 The other one of source/drain regions of write transistor
35 Gate electrode of light emission control transistor
36 One of source/drain regions of light emission control transistor
37 The other one of source/drain regions of light emission control transistor
41 One of electrodes forming capacitor
42 The other one of electrodes forming capacitor
43 Dielectric layer (insulating layer) forming capacitor
51 First electrode of light emitting unit
52 Organic material layer
53 Second electrode of light emitting unit
61, 62, 63, 64, 65, 66, 67 Insulating layer or interlayer insulating layer
70 Contact hole
71, 72, 73, 74 Contact hole and contact pad
100 Power supply unit
100A First power supply unit
100B Second power supply unit
101 Scanning unit
102 Data driver
103 Light emission control unit
$TR_W$ Write transistor
$TR_D$ Driving transistor
$TR_{EL1}$ First light emission control transistor
$TR_{EL2}$ Second light emission control transistor
$C_1$ Capacitor
$C_2$ Auxiliary capacitor
ELP Organic electroluminescence light emitting unit
$C_{EL}$ Capacitance of light emitting unit ELP
SCL Scan line
DTL Data line
PS1 Feeder line
PS1A First feeder line
PS1B Second feeder line
PS2 Common feeder line
CL1 First light emission control line
CL2 Second light emission control line
1020 Digital analog conversion circuit
102A Input signal processing unit
102B Lower gradation control unit
102C Voltage dividing circuit
102D Selector unit
102E Distribution unit
102F Differential amplifier
102FA Current mirror circuit
102FB Differential input unit formed by four differential pairs
102FC Output amplifier
$V_{DD}$ Power supply voltage
$V_{SS}$ Potential
$VGAM_L$ Reference voltage on low gradation side
$VGAM_H$ Reference voltage on high gradation side
Ro Resistive element
$DC_0$ or $DC_P$ Node voltage
DC1, DC2 Output voltage of selector unit
$DP_1$ First differential pair
$DP_2$ Second differential pair
$DP_3$ Third differential pair
$DP_4$ Fourth differential pair
$Q_{1A}$, $Q_{1B}$, $Q_{1C}$ Transistors forming the first differential pair
$Q_{2A}$, $Q_{2B}$, $Q_{2C}$ Transistors forming the second differential pair
$Q_{3A}$, $Q_{3B}$, $Q_{3C}$ Transistors forming the third differential pair
$Q_{4A}$, $Q_{4B}$ r $Q_{4C}$ Transistors forming the fourth differential pair 311 Camera main body unit
312 Shooting lens unit
313 Grip portion
314 Monitor
315 Viewfinder
500 Glasses
511 See-through head mounted display
512 Main body unit
513 Arm
514 Lens barrel

The invention claimed is:

1. A digital analog conversion circuit, comprising:
a selector circuit configured to select a plurality of nodes from a voltage dividing circuit in accordance with bit information of a higher order side of an input digital signal and outputs voltages of the selected nodes; and
a differential amplifier including a plurality of differential pairs to which the output voltages of the selector circuit are input, wherein
a correspondence relationship between the output voltages of the selector circuit and inputs of the respective differential pairs of the differential amplifier is controlled in accordance with bit information of a lower order side of the input digital signal, whereby a voltage corresponding to the digital signal is output from the differential amplifier,
when the voltage corresponding to the digital signal is output, after the correspondence relationship between the output voltages of the selector circuit and the inputs of the respective differential pairs of the differential amplifier is allowed to have a settling time, the correspondence relationship between the output voltages of the selector circuit and the inputs of the respective differential pairs of the differential amplifier is controlled in accordance with the bit information of the lower order side of the input digital signal,
the differential amplifier comprises a first differential pair, a second differential pair, a third differential pair, and a fourth differential pair ratios of weighting on a mutual conductance characteristic of which are 1:1:2:4, and
in the correspondence relationship having the settling time between the output voltages of the selector circuit and the inputs of the respective differential pairs of the differential amplifier, a voltage of one of two nodes selected by the selector circuit is input to the fourth differential pair, and a voltage of the other one is input to the first differential pair, the second differential pair, and the third differential pair.

2. A data driver used for driving a display panel, the data driver comprising a digital to analog conversion circuit according to claim 1.

3. A display device, comprising:
a display panel; and
a data driver used for driving the display panel,
wherein the data driver includes a digital to analog conversion circuit according to claim 1.

4. An electronic apparatus comprising a display device, wherein the display device includes:
a display panel; and
a data driver used for driving the display panel,
the data driver includes a digital to analog conversion circuit according to claim 1.

5. A digital analog conversion circuit, comprising:
a selector circuit configured to select a plurality of nodes from a voltage dividing circuit in accordance with bit information of a higher order side of an input digital signal and outputs voltages of the selected nodes; and
a differential amplifier including a plurality of differential pairs to which the output voltages of the selector circuit are input, wherein
a correspondence relationship between the output voltages of the selector circuit and inputs of the respective differential pairs of the differential amplifier is controlled in accordance with bit information of a lower order side of the input digital signal, whereby a voltage corresponding to the digital signal is output from the differential amplifier,
when the voltage corresponding to the digital signal is output, after the correspondence relationship between the output voltages of the selector circuit and the inputs of the respective differential pairs of the differential amplifier is allowed to have a settling time, the correspondence relationship between the output voltages of the selector circuit and the inputs of the respective differential pairs of the differential amplifier is controlled in accordance with the bit information of the lower order side of the input digital signal, and
a period, in which the correspondence relationship between the output voltages of the selector circuit and the inputs of the respective differential pairs of the differential amplifier is allowed to have the settling time, is set to a predetermined length.

6. A data driver used for driving a display panel, the data driver comprising a digital to analog conversion circuit according to claim 5.

7. A display device, comprising:
a display panel; and
a data driver used for driving the display panel,
wherein the data driver includes a digital to analog conversion circuit according to claim 5.

8. An electronic apparatus comprising a display device, wherein the display device includes:
a display panel; and
a data driver used for driving the display panel,
the data driver includes a digital to analog conversion circuit according to claim 5.

9. A digital analog conversion circuit, comprising:
a selector circuit configured to select a plurality of nodes from a voltage dividing circuit in accordance with bit information of a higher order side of an input digital signal and outputs voltages of the selected nodes; and
a differential amplifier including a plurality of differential pairs to which the output voltages of the selector circuit are input, wherein
a correspondence relationship between the output voltages of the selector circuit and inputs of the respective differential pairs of the differential amplifier is controlled in accordance with bit information of a lower order side of the input digital signal, whereby a voltage corresponding to the digital signal is output from the differential amplifier,
when the voltage corresponding to the digital signal is output, after the correspondence relationship between the output voltages of the selector circuit and the inputs of the respective differential pairs of the differential amplifier is allowed to have a settling time, the correspondence relationship between the output voltages of the selector circuit and the inputs of the respective differential pairs of the differential amplifier is controlled in accordance with the bit information of the lower order side of the input digital signal, and
a length of a period, in which the correspondence relationship between the output voltages of the selector circuit and the inputs of the respective differential pairs of the differential amplifier is allowed to have the settling time, is controlled in accordance with the bit information of the lower order side of the input digital signal.

10. A data driver used for driving a display panel, the data driver comprising a digital to analog conversion circuit according to claim 9.

11. A display device, comprising:
a display panel; and
a data driver used for driving the display panel,
wherein the data driver includes a digital to analog conversion circuit according to claim 9.

12. An electronic apparatus comprising a display device, wherein the display device includes:
a display panel; and
a data driver used for driving the display panel,
the data driver includes a digital to analog conversion circuit according to claim 9.

13. A driving method of a digital analog conversion circuit, the digital analog conversion circuit comprising:
a selector circuit configured to select a plurality of nodes from a voltage dividing circuit in accordance with bit information of a higher order side of an input digital signal and outputs voltages of the selected nodes; and
a differential amplifier including a plurality of differential pairs to which the output voltages of the selector circuit are input,
a correspondence relationship between the output voltages of the selector circuit and inputs of the respective differential pairs of the differential amplifier being controlled in accordance with bit information of a lower order side of the input digital signal, whereby a voltage corresponding to the digital signal being output from the differential amplifier,
the method comprising:
when the voltage corresponding to the digital signal is output, after the correspondence relationship between the output voltages of the selector circuit and the inputs of the respective differential pairs of the differential amplifier is allowed to have a settling time, controlling the correspondence relationship between the output voltages of the selector circuit and the inputs of the respective differential pairs of the differential amplifier in accordance with the bit information of the lower order side of the input digital signal,
wherein a period, in which the correspondence relationship between the output voltages of the selector circuit and the inputs of the respective differential pairs of the differential amplifier is allowed to have the settling time, is set to a predetermined length.

14. A driving method of a digital analog conversion circuit, the digital analog conversion circuit including:
a selector circuit configured to select a plurality of nodes from a voltage dividing circuit in accordance with bit information of a higher order side of an input digital signal and outputs voltages of the selected nodes; and
a differential amplifier including a plurality of differential pairs to which the output voltages of the selector circuit are input,
a correspondence relationship between the output voltages of the selector circuit and inputs of the respective differential pairs of the differential amplifier being controlled in accordance with bit information of a lower order side of the input digital signal, whereby a voltage corresponding to the digital signal being output from the differential amplifier,
the method comprising:
when the voltage corresponding to the digital signal is output, after the correspondence relationship between the output voltages of the selector circuit and the inputs of the respective differential pairs of the differential amplifier is allowed to have a settling time, controlling the correspondence relationship between the output voltages of the selector circuit and the inputs of the respective differential pairs of the differential amplifier in accordance with the bit information of the lower order side of the input digital signal,
wherein a length of a period, in which the correspondence relationship between the output voltages of the selector circuit and the inputs of the respective differential pairs of the differential amplifier is allowed to have the settling time, is controlled in accordance with the bit information of the lower order side of the input digital signal.

* * * * *